United States Patent
Mase et al.

(10) Patent No.: US 8,884,394 B2
(45) Date of Patent: Nov. 11, 2014

(54) RANGE SENSOR AND RANGE IMAGE SENSOR

(71) Applicant: Hamamatsu Photonics K.K., Hamamatsu (JP)

(72) Inventors: Mitsuhito Mase, Hamamatsu (JP); Takashi Suzuki, Hamamatsu (JP); Jun Hiramitsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/644,605

(22) Filed: Oct. 4, 2012

(65) Prior Publication Data

US 2013/0221472 A1 Aug. 29, 2013

Related U.S. Application Data

(60) Provisional application No. 61/605,906, filed on Mar. 2, 2012.

(30) Foreign Application Priority Data

Feb. 28, 2012 (JP) .................................. 2012-041317

(51) Int. Cl.
*H01L 31/0224* (2006.01)

(52) U.S. Cl.
USPC ........... 257/443; 257/431; 257/448; 356/5.01

(58) Field of Classification Search
USPC ......................... 257/443, 431, 448; 356/5.01
See application file for complete search history.

(56) References Cited

U.S. PATENT DOCUMENTS

| 2010/0039546 | A1 | 2/2010 | Cohen et al. |
| 2011/0141452 | A1 | 6/2011 | Mase et al. |
| 2013/0120735 | A1* | 5/2013 | Mase et al. .................... 356/4.01 |

FOREIGN PATENT DOCUMENTS

| JP | 2006-041189 | 2/2006 |
| JP | 2011-112382 | 6/2011 |
| WO | WO 2009-139312 | 11/2009 |

OTHER PUBLICATIONS

T.Y. Lee et al., "A 192×108 pixel ToF-3D image sensor with single-tap concentric-gate demodulation pixels in 0.13 μm technology", Proceedings of the 2011 IEEE International Electron Devices Meeting, Dec. 5-8, 2011, pp. 8.7.1-8.7.4.
English-language translation of International Preliminary Report on Patentability (IPRP) dated Sep. 12, 2014 that issued in WO Patent Application No. PCT/JP2012/078363.

* cited by examiner

*Primary Examiner* — Zandra Smith
*Assistant Examiner* — Damian A Hillman
(74) *Attorney, Agent, or Firm* — Drinker Biddle & Reath LLP

(57) ABSTRACT

A signal charge collecting region is disposed inside a charge generating region so as to be surrounded by the charge generating region, and collects signal charges from the charge generating region. An unnecessary charge collecting region is disposed outside the charge generating region so as to surround the charge generating region, and collects unnecessary charges from the charge generating region. A transfer electrode is disposed between the signal charge collecting region and the charge generating region, and causes the signal charges from the charge generating region to flow into the signal charge collecting region in response to an input signal. An unnecessary charge collecting gate electrode is disposed between the unnecessary charge collecting region and the charge generating region, and causes the unnecessary charges from the charge generating region to flow into the unnecessary charge collecting region in response to an input signal.

13 Claims, 22 Drawing Sheets

RANGE SENSOR AND RANGE IMAGE SENSOR

CROSS-REFERENCE TO RELATED APPLICATIONS

This application is based upon and claims the benefit of priorities from U.S. Provisional application Ser. No. 61/605,906 filed on Mar. 2, 2012, and Japanese Patent Application No. 2012-041317 filed on Feb. 28, 2012, the entire contents of which are incorporated herein by reference.

BACKGROUND OF THE INVENTION

1. Field of the Invention

The present invention relates to a range sensor and a range image sensor.

2. Related Background Art

A TOF (Time-Of-Flight)-type range image sensor (range sensor) is known (see, for example, T. Y. Lee et al., "A 192× 108 pixel ToF-3D image sensor with single-tap concentric-gate demodulation pixels in 0.13 μm technology," Proceedings of the 2011 IEEE International Electron Devices Meeting, Dec. 5-8, 2011, pp. 8.7.1-8.7.4). The range image sensor described in this literature includes a charge generating region configured to generate charges in response to incident light, a charge collecting region disposed inside the charge generating region so as to be surrounded by the charge generating region, a charge discharging region disposed outside the charge generating region so as to surround the charge generating region, an inside gate electrode disposed on the charge generating region and configured to cause charges to flow from the charge generating region into the charge collecting region in response to an input signal, and an outside discharge gate electrode disposed on the charge generating region and configured to cause charges from the charge generating region into the charge discharging region in response to an input signal. Because of a potential difference applied between the inside gate electrode and the outside discharge gate electrode, a potential gradient is formed across regions immediately below the inside gate electrode and the outside discharge gate electrode. Because of this potential gradient, the charges generated in the charge generating region migrate to the charge collecting region or charge discharging region.

SUMMARY OF THE INVENTION

However, the range image sensor described in the literature has the following problem.

When a potential gradient descending from the outside discharge gate electrode side to the inside gate electrode side is formed, charges migrate to the charge collecting region. In this case, a potential formed in the region immediately below the outside discharge gate electrode has a gradient descending to the charge discharging region on the charge discharging region side, and some of the charges generated in the charge generating region migrate to the charge discharging region. Accordingly, a transfer efficiency of the charges to the charge collecting region is deteriorated, and therefore an accuracy of distance detection is also deteriorated. In particular, the outside discharge gate electrode is disposed on the charge generating region, is located outside the inside gate electrode, and has a relatively large area, so that it is easy for some of the charges generated in the charge generating region to migrate to the charge discharging region.

When a potential gradient descending from the inside gate electrode side to the outside discharge gate electrode side is formed, charges migrate to the charge discharging region. In this case, the potential gradient formed in a region immediately below the inside gate electrode is a gradient descending to the charge collecting region on the charge collecting region side, and some of the charges generated in the charge generating region migrate to the charge collecting region. Accordingly, a transfer efficiency of the charges to the charge discharging region is deteriorated, and charges resulting from background light (ambient light) are not discharged and accumulate in the charge discharging region. When charges which should have been discharged are accumulated in the charge discharging region, the accumulation capacity is saturated before a signal is read out. As a result, the accuracy of distance detection is deteriorated.

An object of the present invention is to provide a range sensor and a range image sensor which are capable of improving the accuracy of distance detection.

In an aspect, the present invention is a range sensor comprising: a charge generating region configured to generate charges in response to incident light; a signal charge collecting region disposed inside the charge generating region so as to be surrounded by the charge generating region, and configured to collect signal charges from the charge generating region; an unnecessary charge collecting region disposed outside the charge generating region so as to surround the charge generating region, and configured to collect unnecessary charges from the charge generating region; a photogate electrode disposed on the charge generating region; a transfer electrode disposed between the signal charge collecting region and the charge generating region, and configured to cause the signal charges from the charge generating region to flow into the signal charge collecting region in response to an input signal; and an unnecessary charge collecting gate electrode disposed between the unnecessary charge collecting region and the charge generating region, and configured to cause the unnecessary charges in the charge generating region to flow into the unnecessary charge collecting region in response to an input signal.

In the present invention, the photogate electrode is disposed on the charge generating region, the transfer electrode is disposed between the signal charge collecting region and the charge generating region, and the unnecessary charge collecting gate electrode is disposed between the charge generating region and the unnecessary charge collecting region. When signal charges are transferred to the signal charge collecting region, a potential gradient descending from the unnecessary charge collecting gate electrode side to the transfer electrode side is formed across regions immediately below the photogate electrode, the transfer electrode and the unnecessary charge collecting gate electrode. Accordingly, the charges generated in the charge generating region below the photogate electrode definitely migrate to the signal charge collecting region, but find it difficult to migrate to the unnecessary charge collecting region. As a result, the transfer efficiency of the signal charges is improved. When unnecessary charges are transferred to the unnecessary charge collecting region, a potential gradient descending from the transfer electrode side to the unnecessary charge collecting gate electrode side is formed across regions immediately below the photogate electrodes, the transfer electrodes and the unnecessary charge collecting gate electrode. Accordingly, the charges generated in the charge generating region below the photogate electrode definitely migrate to the unnecessary charge collecting region as unnecessary charges, but find it difficult to move to the signal charge collecting region. As a result, the"

transfer efficiency of the unnecessary charges is improved. As a consequence, the present invention can improve the accuracy of distance detection.

The range sensor may be provided with a plurality of the charge generating regions, a plurality of the signal charge collecting regions, a plurality of the unnecessary charge collecting regions, a plurality of the photogate electrodes, a plurality of the transfer electrodes and a plurality of the unnecessary charge collecting gate electrodes, and the plurality of the transfer electrodes may be supplied respective charge transfer signals having different phases. In this case, the plurality of the charge generating regions corresponds to one pixel, and the distance is calculated based on outputs from the one pixel.

The adjacent unnecessary charge collecting regions may be formed integrally with each other. In this case, the distance between the adjacent charge generating regions is shortened, and therefore a usage efficiency of the sensor area can be increased. As a result, a spatial resolution can be improved.

The plurality of the charge generating regions may be formed as spatially separated from each other. In this case, the unnecessary charge collecting region is located between the adjacent charge generating regions, and therefore unnecessary charges definitely migrate to the unnecessary charge collecting region. Accordingly, the transfer efficiency of the unnecessary charges can be further improved.

The adjacent charge generating regions may be formed integrally with each other, and the adjacent photogate electrodes may be formed integrally with each other. In this case, the charge generating region is expanded with respect to a single charge collecting region, and therefore there is an increase in the signal charges migrating to the charge collecting region. Accordingly, the transfer efficiency of the signal charges can be further improved.

The transfer electrode may be supplied a transfer signal which is intermittently given a phase shift at a predetermined timing. In this case, one charge generating region corresponds to one pixel, and the distance is calculated based on outputs from the same pixel. For this reason, this configuration can reduce the deviation in the calculation of the distance compared to a configuration in which a plurality of the charge generating regions corresponds to one pixel. Furthermore, the usage efficiency of the sensor area can be increased, and the spatial resolution can be improved.

The photogate electrode, the transfer electrode and the unnecessary charge collecting gate electrode may be concentrically disposed around the signal charge collecting region in an order of the transfer electrode, the photogate electrode, and the unnecessary charge collecting gate electrode from the signal charge collecting region side. The signal charge collecting region may be rectangular-shaped when viewed in a plan view, and the photogate electrode, the transfer electrode, and the unnecessary charge collecting gate electrode may be approximately polygonal loop-shaped. The signal charge collecting region may be circular-shaped when viewed in a plan view, and the photogate electrode, the transfer electrode, and the unnecessary charge collecting gate electrode may be approximately circular loop-shaped.

In another aspect, the present invention is a range image sensor which comprises an imaging region including a plurality of units disposed in a one-dimensional or two-dimensional arrangement on a semiconductor substrate and which obtains a range image based on charge quantities output from the units, wherein each of the units is the aforementioned range sensor.

According to the present invention, the accuracy of distance detection can be improved by improving the transfer efficiency of the signal charges and unnecessary charges, as described above.

Adjacent two units out of the plurality of the units may constitute one pixel of the imaging region.

In any one unit out of the plurality of the units and a plurality of units adjacent the any one unit, the any one unit and one unit out of the plurality of the units may constitute one pixel of the imaging region. In this case, the usage efficiency of the sensor area can be increased, thereby improving the spatial resolution.

Each of the units may constitute one pixel of the imaging region. In this case, the distance is calculated based on outputs from the same pixel, and therefore the deviation in the calculation of the distance can be reduced. The usage efficiency of the sensor area can be increased, thereby improving the spatial resolution.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described in detail below with reference to the accompanying drawings. In the description, the same elements or elements with the same functionality will be denoted by the same reference signs, without redundant description.

Figure 1:
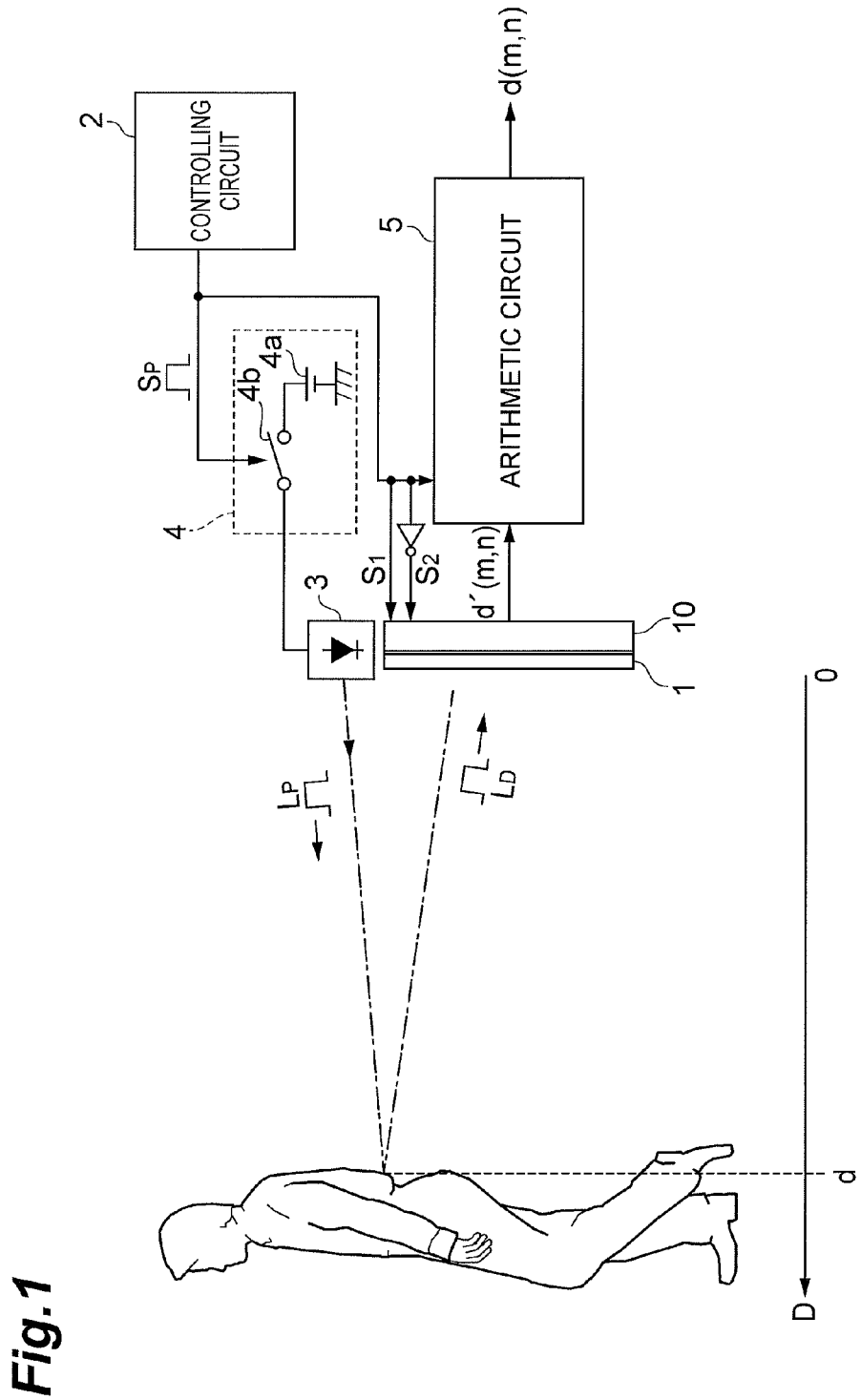
FIG. 1 is an explanatory diagram illustrating a configuration of a distance measuring device according to an embodiment.

FIG. 1 is an explanatory diagram illustrating a configuration of a distance measuring device.

This distance measuring device is provided with a range image sensor 1, a light source 3 configured to emit near-infrared light, a driving circuit 4, a controlling circuit 2, and an arithmetic circuit 5. The driving circuit 4 supplies a pulse drive signal $S_P$ to the light source 3. The controlling circuit 2 supplies detection gate signals $S_1$, $S_2$ synchronized with the pulse drive signal $S_P$ to first and second gate electrodes (TX1, TX2: cf. FIG. 4) included in each pixel of the range image sensor 1. The arithmetic circuit 5 calculates a distance to an object H, such as a pedestrian or the like, based on a signal d'(m, n) indicative of distance information read out from the first and second semiconductor regions (FD1, FD2: cf. FIG. 4) of the range image sensor 1. The distance from the range image sensor 1 to the object H in a horizontal direction D is set to d. The controlling circuit 2 also outputs a charge transfer signal $S_3$ described below.

The controlling circuit 2 inputs a pulse drive signal $S_P$ to the switch 4b of the driving circuit 4. The light source 3 for projection of light including an LED or a laser diode is connected to a power source 4a via the switch 4b. When the pulse drive signal $S_P$ is input to the switch 4b, a drive current having the same waveform as the pulse drive signal $S_P$ is supplied to the light source 3, and the light source 3 outputs pulsed light $L_P$ as probe light for distance measurement. When the pulse light $L_P$ is irradiated onto the object H, the pulse light is reflected from the object H. The reflected pulse light is incident into the range image sensor 1 as pulse light $L_D$, and a pulse detection signal $S_D$ is output.

The range image sensor 1 is disposed on a wiring board 10. The signal d'(m, n) including distance information is output from each pixel of the range image sensor 1 via wiring of the wiring board 10.

The waveform of the pulse drive signal Sp is a rectangular wave having period T. Assuming that a high level is "1" and a low level is "0," the voltage V(t) of the pulse drive signal $S_P$ is given as the following equations:

Pulse drive signal $S_P$:

$V(t)=1$(in the case of $0<t<(T/2)$);

$V(t)=0$(in the case of $(T/2)<t<T$);

$V(t+T)=V(t)$.

The waveforms of the detection gate signals $S_1$, $S_2$ are rectangular waves having period T. The voltage V(t) of the detection gate signals $S_1$, $S_2$ is given as the following equations:

Detection gate signal $S_1$:

$V(t)=1$(in the case of $0<t<(T/2)$);

$V(t)=0$(in the case of $(T/2)<t<T$);

$V(t+T)=V(t)$.

Detection gate signal $S_2$ (=inversion of $S_1$)):

$V(t)=0$(in the case of $0<t<(T/2)$);

$V(t)=1$(in the case of $(T/2)<t<T$);

$V(t+T)=V(t)$.

The foregoing pulse signals $S_P$, $S_1$, $S_2$, $S_D$ all have pulse period ($2\times T_P$). When the detection gate signal $S_1$ and the pulse detection signal $S_D$ are all "1," a charge quantity generated in the range image sensor 1 is set to Q1. When the detection gate signal $S_2$ and the pulse detection signal $S_D$ are all "1," a charge quantity generated in the range image sensor 1 is set to Q2.

A phase difference between the detection gate signal $S_1$ and the pulse detection signal $S_D$ is proportional to the charge quantity Q2 generated in the range image sensor 1 in an overlap duration in which the detection gate signal $S_2$ and the pulse detection signal $S_D$ are "1." That is, the charge quantity Q2 is a charge quantity which is generated in the duration in which the logical AND of the detection gate signal $S_2$ and the pulse detection signal $S_D$ is "1." When the total charge quantity generated within a single pixel is Q1+Q2 and the half-period pulse width of the pulse drive signal $S_P$ is $T_P$, the pulse detection signal $S_D$ lags behind the pulse drive signal $S_P$ by $\Delta t=T_P\times Q2/(Q1+Q2)$. The time of flight $\Delta t$ of one light pulse is given by $\Delta t=2d/c$, where d is the distance to the object and c the speed of light. For this reason, when the two charge quantities (Q1, Q2) are output as a signal d'(m, n) having the distance information from a specific pixel, the arithmetic circuit 5 calculates the distance $d=(c\times\Delta t)/2=c\times T_P\times Q2/(2\times(Q1+Q2))$ to the object H, based on the input charge quantities Q1, Q2 and the predetermined half-period pulse width $T_P$.

As described above, the arithmetic circuit 5 can calculate the distance d by separately reading out the charge quantities Q1, Q2. The foregoing pulses are repeatedly emitted and integral values thereof can be output as respective charge quantities Q1, Q2.

The ratios of the charge quantity Q2 to the total charge quantity correspond to the above-described phase difference, that is, the distance to the object H. The arithmetic circuit 5 calculates the distance to the object H based on the phase difference. As described above, when the time difference corresponding to the phase difference is set to $\Delta t$, the distance d is preferably given by $d=(c\times\Delta t)/2$, but an appropriate correction operation may be performed in addition thereto. For example, if an actual distance is different from the calculated distance d, a factor β to correct the latter is preliminarily obtained and the finally calculated distance d is obtained by multiplying the factor β to the calculated distance d in a product after shipped. Another available correction is such that an ambient temperature is measured, an operation to correct the speed of light c is performed if the speed of light c differs depending upon the ambient temperature, and then the distance calculation is performed. It is also possible to preliminarily store in a memory a relation between signals input into the arithmetic circuit and actual distances, and determine the distance by a lookup table method. The calculation method can be modified depending upon the sensor structure and the conventionally known calculation methods can be applied thereto.

Figure 2:
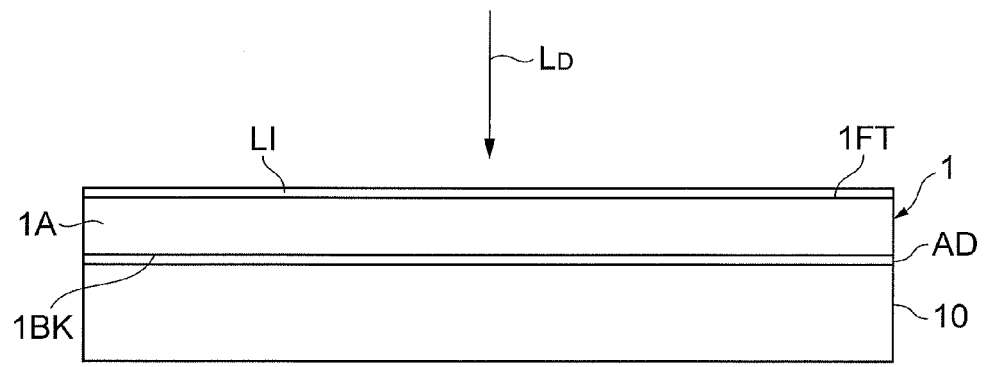
FIG. 2 is a diagram for explaining a cross-sectional configuration of a range image sensor.

FIG. 2 is a diagram for explaining a cross-sectional configuration of the range image sensor.

The range image sensor 1 is a front-illuminated type range image sensor, and has a semiconductor substrate 1A. Pulse light $L_D$ is incident through a light incident surface 1FT of the semiconductor substrate 1A into the range image sensor 1. The back surface 1BK of the range image sensor 1 opposite the light incident surface 1FT is connected through an adhesive region AD to the wiring board 10. The adhesive region AD includes an insulating adhesive and a filler. The range image sensor 1 includes a light-shielding layer LI having an opening at a predetermined location. The light-shielding layer LI is disposed on the front of the light incident surface 1FT.

Figure 3:
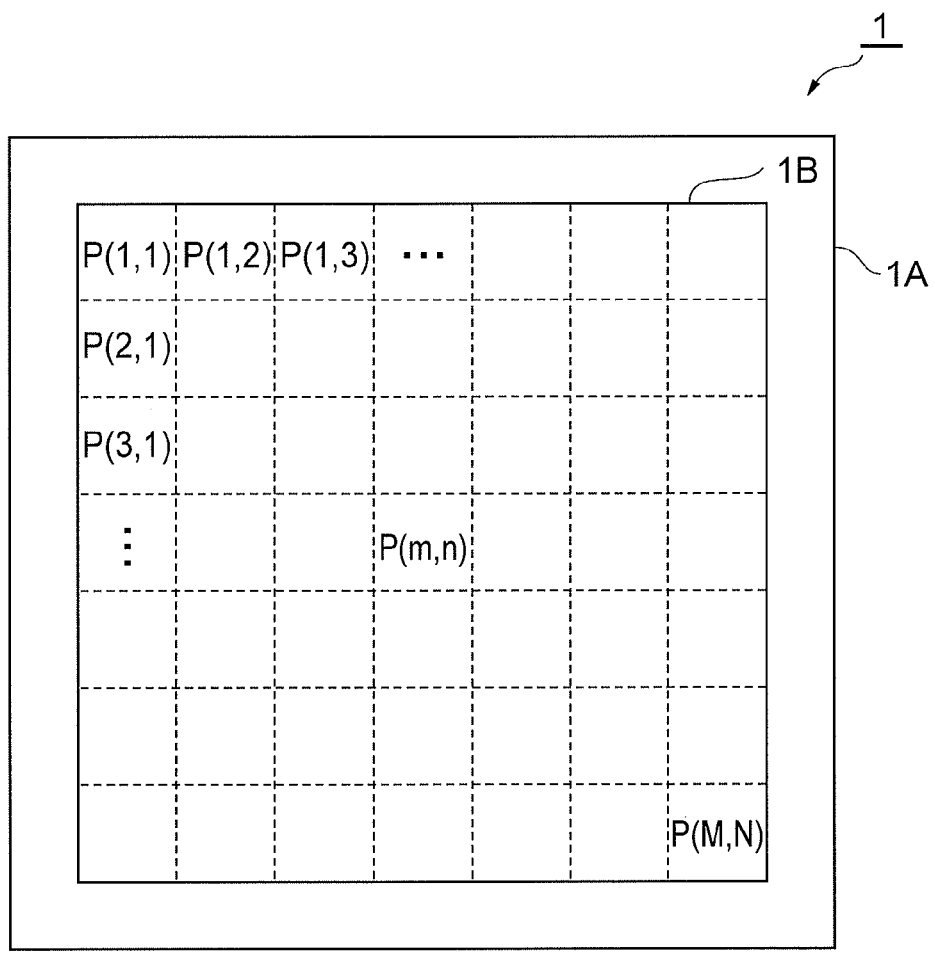
FIG. 3 is a schematic plan view of the range image sensor.

FIG. 3 is a schematic plan view of the range image sensor.

In the range image sensor 1, the semiconductor substrate 1A has an imaging region 1B which includes a plurality of pixels P(m, n) which are disposed in a two-dimensional arrangement. Each pixel P(m, n) outputs two charge quantities (Q1, Q2) as the aforementioned signal d'(m, n) having the distance information. Each pixel P(m, n) functions as a microscopic distance measuring sensor, and outputs the signal d'(m, n) based on the distance to the object H. Therefore, when light reflected from the object H is focused on the imaging region 1B, a range image of the object as a collection of distance information to respective points on the object H can be acquired. A single pixel P(m, n) functions as a single range sensor.

Figure 4:
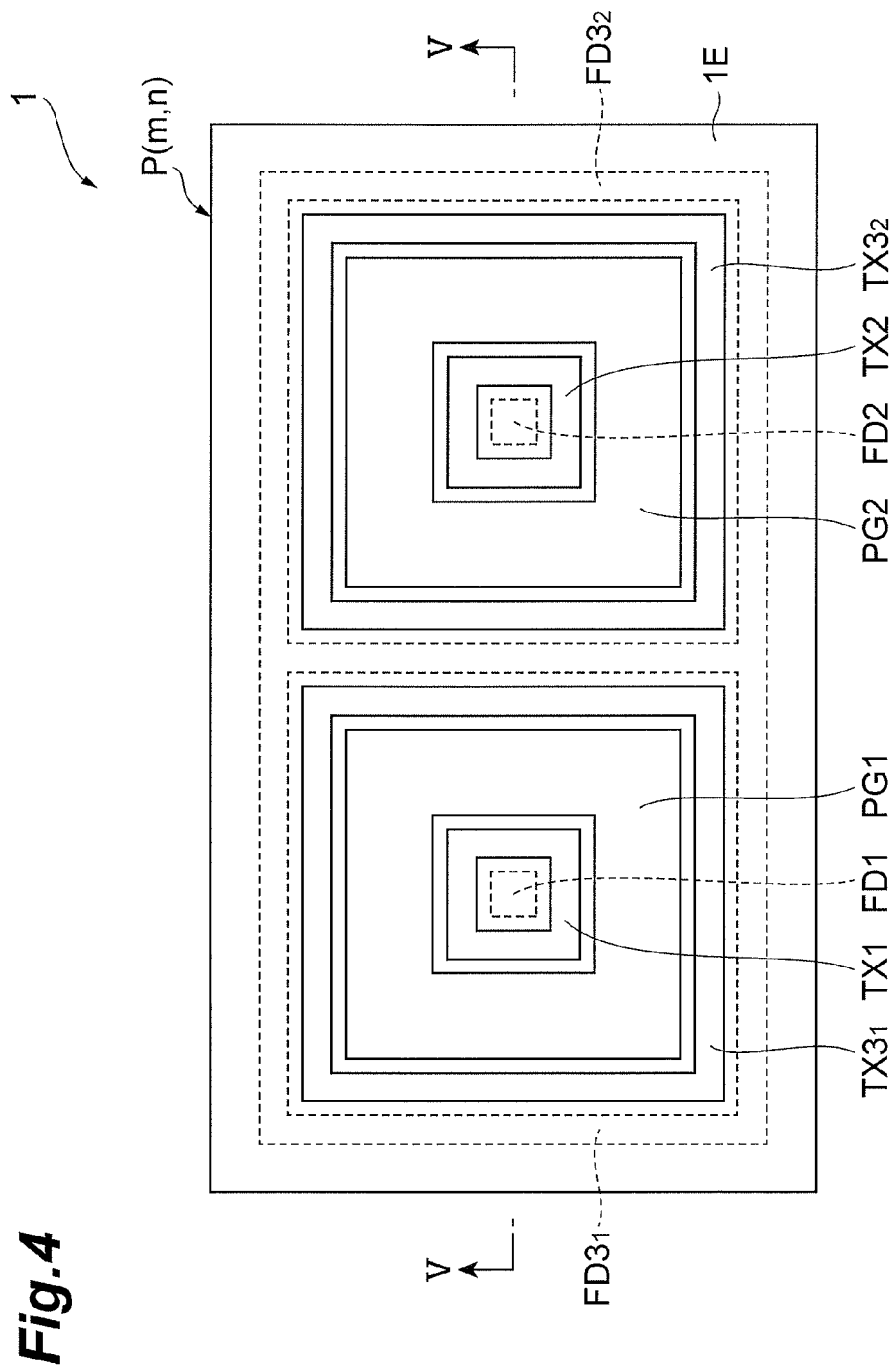
FIG. 4 is a schematic diagram for explaining a configuration of a pixel of the range image sensor.
Figure 5:
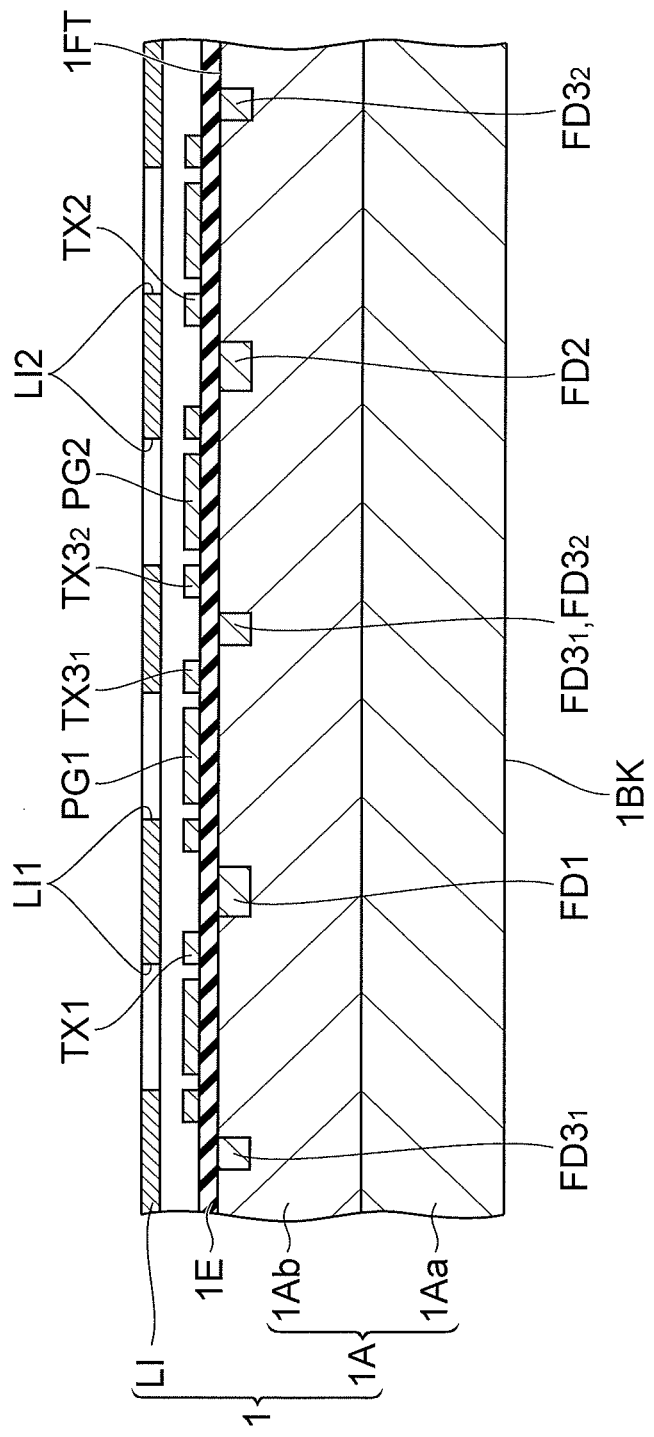
FIG. 5 is a diagram illustrating a cross-sectional configuration along line V-V in FIG. 4.

FIG. 4 is a schematic diagram for explaining a configuration of a pixel in the range image sensor. FIG. 5 is a diagram illustrating a cross-sectional configuration along the line V-V in FIG. 4.

The range image sensor 1, as shown in FIG. 2, is provided with the semiconductor substrate 1A having the light incident surface 1FT and the back surface 1BK opposed to each other. The semiconductor substrate 1A has a p-type first substrate region 1Aa located on the back surface 1BK side, and a p$^-$-type second substrate region 1Ab located on the light incident surface 1FT side. The second substrate region 1Ab has a higher impurity concentration than the first substrate region 1Aa. The semiconductor substrate 1A may be acquired, for example, by growing a p$^-$-type epitaxial layer on a p-type semiconductor substrate, the p$^-$-type epitaxial layer has a lower impurity concentration than the semiconductor substrate.

In each pixel P(m, n), the range image sensor 1 is provided with a plurality of photogate electrodes (in the present embodiment, two photogate electrodes) PG1, PG2, first and second gate electrodes TX1, TX2, a plurality of third gate electrodes (in the present embodiment, two third gate electrodes) TX3$_1$, TX3$_2$, first and second semiconductor regions FD1, FD2, and a plurality of third semiconductor regions (in the present embodiment, two third semiconductor regions) FD3$_1$, FD3$_2$.

The two photogate electrodes PG1, PG2 are provided through an insulating layer 1E on the light incident surface 1FT, and are arranged as spatially separated from each other. The first and third gate electrodes TX1, TX3$_1$ are provided through an insulating layer 1E on the light incident surface 1FT, and are located adjacent to the photogate electrode PG1. The second and third gate electrodes TX2, TX3$_2$ are provided through an insulating layer 1E on the light incident surface 1FT, and are located adjacent to the photogate electrode PG2. The first and second semiconductor regions FD1, FD2 accumulate respective charges flowing into regions immediately below the corresponding gate electrodes TX1, TX2. In the present embodiment, the semiconductor substrate 1A is comprised of Si, and the insulating layer 1E is comprised of SiO$_2$.

Approximately polygonal loop-shaped openings LI1, LI2 are formed in the light-shielding layer LI. These openings LI1, LI2 have a rectangular loop-shape. Light (reflected light from the object H) is incident upon the semiconductor substrate 1A through the openings LI1, LI2 of the light-shielding layer LI. Therefore, rectangular loop-shaped light receiving regions are defined in the semiconductor substrate 1A by the openings LI1, LI2. The light-shielding layer LI is comprised of, for example, metal such as aluminum.

The photogate electrodes PG1, PG2 are disposed to correspond to the openings LI1, LI2. The shapes of the photogate electrodes PG1, PG2 also correspond to those of the openings LI1, LI2, and are approximately polygonal loop shape when viewed in a plan view. In the present embodiment, the photogate electrodes PG1, PG2 are rectangular loop-shaped. Although the photogate electrodes PG1, PG2 are comprised of polysilicon, they may be comprised of other materials.

The first semiconductor region FD1 is disposed inside the photogate electrode PG1 so as to be surrounded by the photogate electrode PG1. The first semiconductor region FD1 is arranged as spatially separated from a region immediately below the photogate electrode PG1. That is, the first semiconductor region FD1 is disposed inside the light receiving region so as to be surrounded by the light receiving region, and is arranged as spatially separated from the light receiving region.

The second semiconductor region FD2 is disposed inside the photogate electrode PG2 so as to be surrounded by the photogate electrode PG2. The second semiconductor region FD2 is arranged as spatially separated from a region immediately below the photogate electrode PG2. That is, the second semiconductor region FD2 is disposed inside the light receiving region so as to be surrounded by the light receiving region, and is arranged as spatially separated from the light receiving region.

The first and second semiconductor regions FD1, FD2 are approximately polygon-shaped when viewed in a plan view. In the present embodiment, the first and second semiconductor regions FD1, FD2 are rectangle-shaped (in detail, square-shaped). The first and second semiconductor regions FD1, FD2 function as signal charge collecting regions. The first and second semiconductor regions FD1, FD2 are regions comprised of high-impurity concentration n-type semiconductors, and are floating diffusion regions.

The first gate electrode TX1 is disposed between the photogate electrode PG1 (light receiving region) and the first semiconductor region FD1. The first gate electrode TX1 is located outside the first semiconductor region FD1 so as to surround the first semiconductor region FD1, and is also located inside the photogate electrode PG1 so as to be surrounded by the photogate electrode PG1. The first gate electrode TX1 is arranged as spatially separated from the photogate electrode PG1 and the first semiconductor region FD1 so as to be interposed between the photogate electrode PG1 and the first semiconductor region FD1.

The second gate electrode TX2 is disposed between the photogate electrode PG2 (light receiving region) and the second semiconductor region FD2. The second gate electrode TX2 is located outside the second semiconductor region FD2 so as to surround the second semiconductor region FD2, and is also located inside the photogate electrode PG2 so as to be surrounded by the photogate electrode PG2. The second gate electrode TX2 is arranged as spatially separated from the photogate electrode PG2 and the second semiconductor region FD2 so as to be interposed between the photogate electrode PG2 and the second semiconductor region FD2.

The first and second gate electrodes TX1, TX2 are approximately polygonal loop-shaped when viewed in a plan view. In the present embodiment, the first and second gate electrodes TX1, TX2 are rectangular loop-shaped. Although the first and second gate electrodes TX1, TX2 are comprised of polysilicon, they may be comprised of other materials. The first and second gate electrodes TX1, TX2 function as transfer electrodes.

The third semiconductor region $FD3_1$ is located outside the photogate electrode PG1 so as to surround the photogate electrode PG1. The third semiconductor region $FD3_1$ is arranged as spatially separated from a region immediately below the photogate electrode PG1. That is, the third semiconductor region $FD3_1$ is disposed outside the light receiving region so as to surround the light receiving region, and is also arranged as spatially separated from the light receiving region.

The third semiconductor region $FD3_2$ is located outside the photogate electrode PG2 so as to surround the photogate electrode PG2. The third semiconductor region $FD3_2$ is arranged as spatially separated from a region immediately below the photogate electrode PG2. That is, the third semiconductor region $FD3_2$ is disposed outside the light receiving region so as to surround the light receiving region, and is also arranged as spatially separated from the light receiving region.

The third semiconductor regions $FD3_1$, $FD3_2$ are approximately polygonal loop-shaped when viewed in a plan view. In the present embodiment, the third semiconductor regions $FD3_1$, $FD3_2$ are rectangular loop-shaped. Furthermore, in the present embodiment, the adjacent third semiconductor regions $FD3_1$, $FD3_2$ are formed integrally with each other. That is, the third semiconductor region $FD3_1$ and the third semiconductor region $FD3_2$ share a region interposed between the photogate electrode PG1 (light receiving region) and the photogate electrode PG2 (light receiving region). The third semiconductor regions $FD3_1$, $FD3_2$ function as unnecessary charge collecting regions. The third semiconductor regions $FD3_1$, $FD3_2$ are regions comprised of high-impurity concentration n-type semiconductors, and are floating diffusion regions.

The third gate electrode $TX3_1$ is disposed between the photogate electrode PG1 (light receiving region) and the third semiconductor region $FD3_1$. The third gate electrode $TX3_1$ is located outside the photogate electrode PG1 so as to surround the photogate electrode PG1, and is located inside the third semiconductor region $FD3_1$ so as to be surrounded by the third semiconductor region $FD3_1$. The third gate electrode $TX3_1$ is arranged as spatially separated from the photogate electrode PG1 and the third semiconductor region $FD3_1$ so as to be interposed between the photogate electrode PG1 and the third semiconductor region $FD3_1$.

The third gate electrode $TX3_2$ is disposed between the photogate electrode PG2 (light receiving region) and the third semiconductor region $FD3_2$. The third gate electrode $TX3_2$ is located outside the photogate electrode PG2 so as to surround the photogate electrode PG2, and is located inside the third semiconductor region $FD3_2$ so as to be surrounded by the third semiconductor region $FD3_2$. The third gate electrode $TX3_2$ is arranged as spatially separated from the photogate electrode PG2 and the third semiconductor region $FD3_2$ so as to be interposed between the photogate electrode PG2 and the third semiconductor region $FD3_2$.

The third gate electrodes $TX3_1$, $TX3_2$ are approximately polygonal loop-shaped when viewed in a plan view. In the present embodiment, the third gate electrode $TX3_1$, $TX3_2$ are rectangular loop-shaped. Although the third gate electrodes $TX3_1$, $TX3_2$ are comprised of polysilicon, they may be comprised of other materials. The third gate electrodes $TX3_1$, $TX3_2$ function as unnecessary charge collecting gate electrodes.

The photogate electrode PG1, the first gate electrode TX1 and the third gate electrode $TX3_1$ are concentrically disposed around the first semiconductor region FD1 in the order of the first gate electrode TX1, the photogate electrode PG1 and the third gate electrode $TX3_1$ from the first semiconductor region FD1 side. The photogate electrode PG2, the second gate electrode TX2 and the third gate electrode $TX3_2$ are concentrically disposed around the second semiconductor region FD2 in the order of the second gate electrode TX2, the photogate electrode PG2 and the third gate electrode $TX3_2$ from the second semiconductor region FD2 side.

The thickness/impurity concentration of each of the regions is as follows:

first substrate region 1Aa of semiconductor substrate 1A: thickness 5~700 μm/impurity concentration $1\times10^{18}$~$10^{20}$ cm$^{-3}$ second substrate region 1Ab of semiconductor substrate 1A: thickness 3~50 μm/impurity concentration $1\times10^{13}$~$10^{16}$ cm$^{-3}$ first and second semiconductor regions FD1, FD2: thickness 0.1~0.4 μm/impurity concentration $1\times10^{18}$~$10^{20}$ cm$^{-3}$ third semiconductor regions $FD3_1$, $FD3_2$: thickness 0.1~0.4 μm/impurity concentration $1\times10^{18}$~$10^{20}$ cm$^{-3}$ Contact holes (not shown) are formed through the insulating layer 1E so as to expose the surfaces of the first to third semiconductor regions FD1, FD2, $FD3_1$, $FD3_2$ to the outside. Conductors (not shown) are disposed in the contact holes so as to connect the first to third semiconductor regions FD1, FD2, $FD3_1$, $FD3_2$ to the outside.

The light-shielding layer LI covers a region where the first to third gate electrodes TX1, TX2, $TX3_1$, $TX3_2$ and the first to third semiconductor regions FD1, FD2, $FD3_1$, $FD3_2$ are disposed in the semiconductor substrate 1A, and prevents light from being incident upon the corresponding region. This can prevent unnecessary charges from being generated by light which is incident upon the region.

The regions corresponding to the photogate electrodes PG1, PG2 in the semiconductor substrate 1A (regions immediately below the photogate electrodes PG1, PG2) function as charge generating regions where charges are generated in response to the incident light. Therefore, the charge generating regions are rectangular loop-shaped in response to the shapes of the photogate electrodes PG1, PG2 and the openings LI1, LI2. In the range image sensor 1, a first unit including the photogate electrode PG1 (charge generating region immediately below the photogate electrode PG1) and a second unit including the photogate electrode PG2 (charge generating region immediately below the photogate electrode PG2) are located adjacent to each other. The first and second units located adjacent to each other form a single pixel P(m, n).

When a high level signal (positive electric potential) is supplied to the first gate electrode TX1, a potential below the first gate electrode TX1 becomes lower than a potential in the region immediately below the photogate electrode PG1 in the semiconductor substrate 1A. This causes negative charges (electrons) to be drawn toward the first gate electrode TX1, and to be accumulated in a potential well formed by the first semiconductor region FD1. The first gate electrode TX1 causes a signal charge to flow into the first semiconductor region FD1 in response to the input signal. An n-type semiconductor contains a positively ionized donor and has a positive potential, so as to attract electrons. When a low level signal (for example, a ground electric potential) is supplied to the first gate electrode TX1, a potential barrier is generated by the first gate electrode TX1. Therefore, the charges generated in the semiconductor substrate 1A are not drawn into the first semiconductor region FD1.

When a high level signal (positive electric potential) is supplied to the second gate electrode TX2, a potential below the second gate electrode TX2 becomes lower than a potential in the region immediately below the photogate electrode PG2 in the semiconductor substrate 1A. This causes negative charges (electrons) to be drawn toward the second gate electrode TX2, and to be accumulated in a potential well formed by the second semiconductor region FD2. The second gate electrode TX2 causes a signal charge to flow into the second semiconductor region FD2 in response to the input signal. When a low level signal (for example, a ground electric potential) is supplied to the second gate electrode TX2, a potential barrier is generated by the second gate electrode TX2. Therefore, the charges generated in the semiconductor substrate 1A are not drawn into the second semiconductor region FD2.

When a high level signal (a positive electric potential) is supplied to the third gate electrodes $TX3_1$, $TX3_2$, potentials in regions immediately below the third gate electrodes $TX3_1$, $TX3_2$ become lower than the potentials in regions immediately below the photogate electrodes PG1, PG2 in the semiconductor substrate 1A. This causes negative charges (electrons) to be drawn toward the third gate electrodes $TX3_1$, $TX3_2$, and to flow into potential wells formed by the third semiconductor regions $FD3_1$, $FD3_2$. When a low level signal (for example, a ground electric potential) is supplied to the third gate electrodes $TX3_1$, $TX3_2$, potential barriers are generated by the third gate electrodes $TX3_1$, $TX3_2$. Therefore, the charges generated in the semiconductor substrate 1A are not drawn into the third semiconductor regions $FD3_1$, $FD3_2$. The third semiconductor regions $FD3_1$, $FD3_2$ collect some of the charges generated in the charge generating region in response to the incidence of light as unnecessary charges.

In the range image sensor 1, charges generated in the deep portion of the semiconductor in response to incidence of light for projection are drawn into the potential well provided on the light incident surface 1FT side. As a result, high-speed and accurate distance measurement is possible.

Pulse light LD from the object, incident through the light incident surface 1FT of the semiconductor substrate 1A, reaches the light receiving region (charge generating region) disposed on the surface side of the semiconductor substrate 1A. The charges generated in the semiconductor substrate 1A in response to the incidence of pulse light are transferred from each of the charge generating regions (each of the regions immediately below the photogate electrodes PG1, PG2) to regions immediately below the first or second gate electrode TX1, TX2 adjacent to the corresponding charge generating region. That is, when the detection gate signals $S_1$, $S_2$ synchronized with the pulse drive signal $S_P$ for the light source are alternately supplied to the first and second gate electrodes TX1, TX2 via the wiring substrate 10, the charges generated in each charge generating region flow into a corresponding region immediately below the first or second gate electrode TX1, TX2, and then flow therefrom to the first or second semiconductor region FD1, FD2.

The ratio of the charge quantity Q2 accumulated in the second semiconductor region FD2 to the total charge quantity (Q1+Q2) corresponds to the phase difference between the emitted pulse light emitted with supply of the pulse drive signal $S_p$ to the light source and the detected pulse light returning after reflection of the emitted pulsed light on the object H.

Although not shown in the diagrams, the range image sensor 1 is provided with a back-gate semiconductor region for fixing the electric potential of the semiconductor substrate 1A to a reference electric potential.

Figure 6:
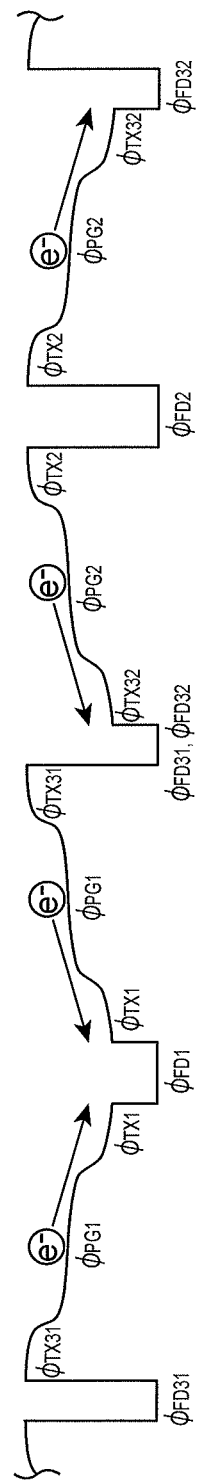
FIG. 6 is a diagram illustrating a potential profile, for explaining accumulation and discharge operations of charge.
Figure 7:
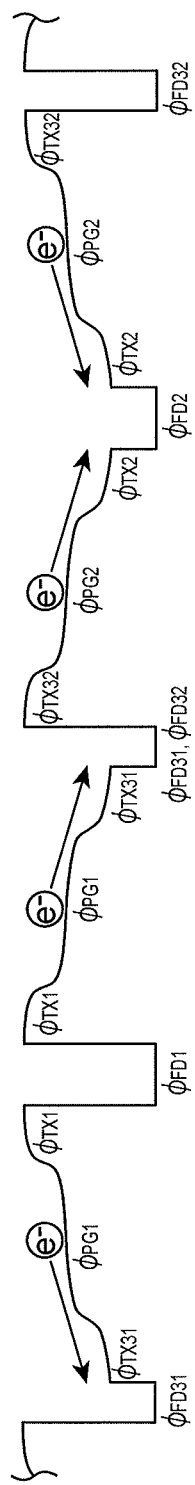
FIG. 7 is a diagram illustrating a potential profile, for explaining accumulation and discharge operations of charge.

FIGS. 6 and 7 are diagrams illustrating potential profiles near the light incident surface 1FT of the semiconductor substrate 1A for explaining accumulation and discharge operations of charge. In FIGS. 6 and 7, a downward direction is a positive potential direction. FIGS. 6 and 7 illustrate the potential profiles along the line V-V of FIG. 4.

When light is incident, potentials $\phi_{PG1}$, $\phi_{PG2}$ in regions immediately below the photogate electrodes PG1, PG2 are set slightly higher than the substrate electric potential due to an electric potential (for example, the intermediate electric potential between a higher electric potential and a lower electric potential supplied to the first and second gate electrodes TX1, TX2) supplied to the photogate electrodes PG1, PG2. In each of the diagrams, a potential $\phi_{TX1}$ in the region immediately below the first gate electrode TX1, a potential $\phi_{TX2}$ in the region immediately below the second gate electrode TX2, potentials $\phi_{TX31}$, $\phi_{TX32}$ in the regions immediately below the third gate electrodes $TX3_1$, $TX3_2$, a potential $\phi_{FD1}$ in the first semiconductor region FD1, a potential $\phi_{FD2}$ in the second semiconductor region FD2 and potentials $\phi_{FD31}$, $\phi_{FD32}$ in the third semiconductor regions $FD3_1$, $FD3_2$ are illustrated.

When a high electric potential of the detection gate signal $S_1$ is input to the first gate electrode TX1, the charges generated immediately below the photogate electrode PG1 are accumulated in the potential well of the first semiconductor region FD1 through the region immediately below the first gate electrode TX1 according to a potential gradient, as shown in FIG. 6. The charge quantity Q1 is accumulated in the potential well of the first semiconductor region FD1. While the detection gate signal $S_1$ is being applied to the first gate electrode TX1, a low level electric potential (e.g., ground electric potential) is supplied to the third gate electrode $TX3_1$. For this reason, the potential $\phi_{TX31}$ in the region immediately below the third gate electrode $TX3_1$ is not lowered, so that charges do not flow into the potential well of the third semiconductor region $FD3_1$.

A low level electric potential (for example, a ground electric potential) is supplied to the second gate electrode TX2. For this reason, the potential $\phi_{TX2}$ in the region immediately below the second gate electrode TX2 is not lowered, and charges do not flow into the potential well of the second semiconductor region FD2. When a positive electric potential is supplied to the third gate electrode $TX3_2$, the charges generated in the charge generating region (the region immediately below the photogate electrode PG2) flow into the potential well of the third semiconductor region $FD3_2$ as the potential $\phi_{TX32}$ in the region immediately below the third gate electrode $TX3_2$ is lowered. This causes charges, generated in the charge generating regions, to be collected in the potential well of the third semiconductor region $FD3_2$ as unnecessary charges. The unnecessary charges collected in the potential well of the third semiconductor region $FD3_2$ are discharged to the outside.

When the high electric potential of the detection gate signal $S_2$ is input to the second gate electrode TX2, subsequent to the detection gate signal $S_1$, the charges generated in the region immediately below the photogate electrode PG2 are accumulated in the potential well of the second semiconductor region FD2 through the region immediately below the second gate electrode TX2 according to a potential gradient, as shown in FIG. 7. The charge quantity Q2 is accumulated in the potential well of the second semiconductor region FD2. While the detection gate signal $S_2$ is being applied to the second gate electrode TX2, a low level electric potential (for example, a ground electric potential) is supplied to the third gate electrode $TX3_2$. For this reason, the potential $\phi_{TX32}$ in the region immediately below the third gate electrode $TX3_2$ is not lowered, so that charges do not flow into the potential well of the third semiconductor region $FD3_2$.

A low level electric potential (for example, a ground electric potential) is supplied to the first gate electrode TX1. For this reason, the potential $\phi_{TX1}$ in the region immediately below the first gate electrode TX1 is not lowered, and charges do not flow into the potential well of the first semiconductor region FD1. Meanwhile, when a positive electric potential is supplied to the third gate electrode $TX3_1$, the charges generated in the charge generating region (the region immediately below the photogate electrode PG1) flow into the potential well of the third semiconductor region $FD3_1$ as the potential $\phi_{TX31}$ in the region immediately below the third gate electrode $TX3_1$ is lowered. This causes charges, generated in the charge generating regions, to be collected in the potential well of the third semiconductor region $FD3_1$ as unnecessary charges. The unnecessary charges collected in the potential well of the third semiconductor region $FD3_1$ are discharged to the outside.

Figure 8:
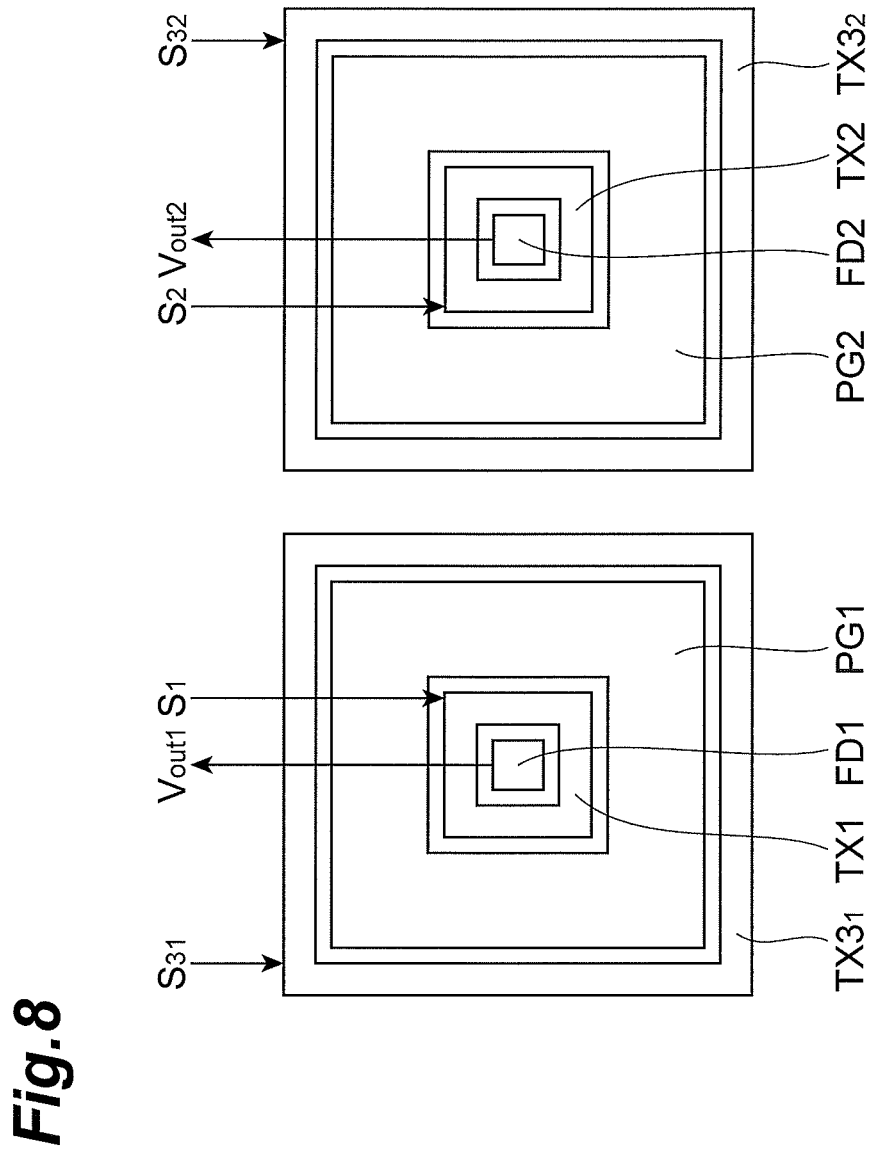
FIG. 8 is a schematic diagram for explaining a configuration of a pixel.

FIG. 8 is a schematic diagram for explaining a configuration of a pixel.

The detection gate signal $S_1$, which is a charge transfer signal, is supplied to the first gate electrode TX1. The detection gate signal $S_2$, which is a charge transfer signal, is given to the second gate electrode TX2. That is, charge transfer signals having different phases are supplied to the first gate electrode TX1 and the second gate electrode TX2. Charge transfer signals $S_{31}$, $S_{32}$ are given to the third gate electrodes $TX3_1$, $TX3_2$.

The charges generated in the charge generating region (the region immediately below photogate electrode PG1) flow into a potential well constructed by the first semiconductor region FD1 as signal charges while the high level detection gate signal $S_1$ is supplied to the first gate electrode TX1. The signal charges accumulated in the first semiconductor region FD1 are read out as an output ($V_{out1}$) corresponding to the charge quantity Q1 from the first semiconductor region FD1. The charges generated in the charge generating region (the region immediately below the photogate electrode PG2) flow into a potential well constructed by the second semiconductor region FD2 as signal charges while the high level detection gate signal $S_2$ is supplied to the second gate electrode TX2. The signal charges accumulated in the second semiconductor region FD2 are read out as an output ($V_{out2}$) corresponding to the charge quantity Q2 from the second semiconductor region FD2. These outputs ($V_{out1}$, $V_{out2}$) correspond to the above-described signal d'(m, n).

Figure 9:
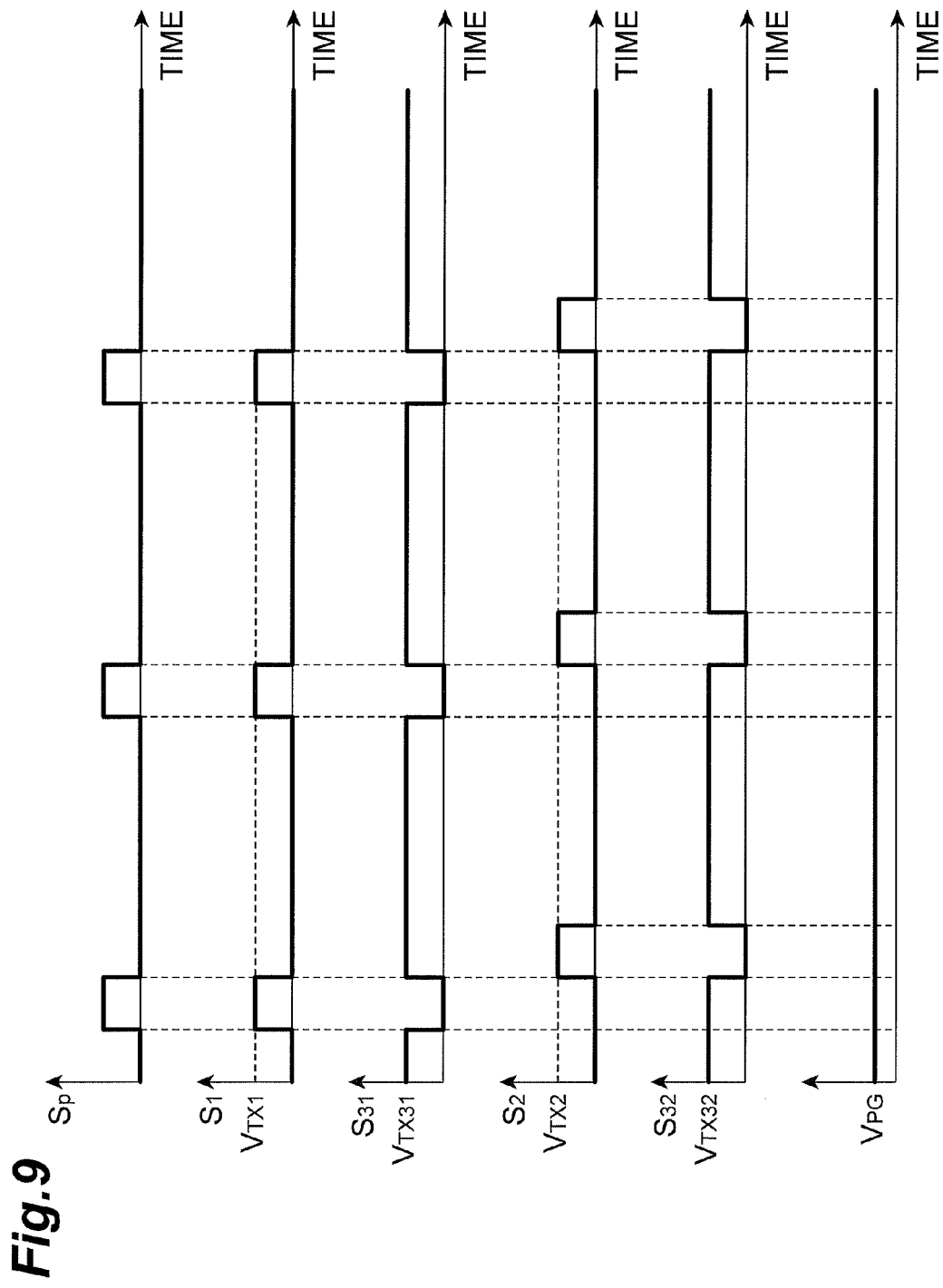
FIG. 9 is a timing chart of various signals.

FIG. 9 is a timing chart of actual various signals.

The period of a single frame consists of a period for accumulation of signal charge (accumulation period) and a period for readout of signal charge (readout period). With focus on a single pixel, during the accumulation period, a signal based on the pulse drive signal $S_P$ is applied to the light source, and the detection gate signal $S_1$ is applied to the first gate electrode TX1, in synchronism therewith. Furthermore, the detection gate signal $S_2$ having a predetermined phase difference (for example, a phase difference of 180°) with respect to the detection gate signal $S_1$ is applied to the second gate electrode TX2. Prior to the measurement of the distance, a reset signal is applied to the first and second semiconductor regions FD1, FD2, and charges accumulated therein are discharged to the outside. After the reset signal is turned on and then turned off, the pulses of the detection gate signals $S_1$, $S_2$ are sequentially applied to the first and second gate electrodes TX1, TX2, and furthermore charges are sequentially transferred in synchronization with the pulses. Then, the signal charges are integrated and accumulated in the first and second semiconductor regions FD1, FD2.

Thereafter, during the readout period, the signal charges accumulated in the first and second semiconductor regions FD1, FD2 are read out. At this time, the charge transfer signals $S_{31}$, $S_{32}$ applied to the third gate electrodes $TX3_1$, $TX3_2$ is at the high level, and therefore positive electric potentials are supplied to the third gate electrodes $TX3_1$, $TX3_2$, whereby unnecessary charges are collected in the potential wells of the third semiconductor regions $FD3_1$, $FD3_2$. The detection gate signal $S_1$ and the charge transfer signal $S_{31}$ have opposite phases. The detection gate signal $S_2$ and the charge transfer signal $S_{32}$ have opposite phases.

An electric potential $V_{PG}$ supplied to the photogate electrodes PG1, PG2 is set lower than the electric potentials $V_{TX1}$, $V_{TX2}$, $V_{TX31}$, $V_{TX32}$. As a consequence, when the detection gate signals $S_1$, $S_2$ are at the high level, the potentials $\phi_{TX1}$, $\phi_{TX2}$ are lower than the potentials $\phi_{PG1}$, $\phi_{PG2}$. When the charge transfer signals $S_{31}$, $S_{32}$ are at the high level, the potentials $\phi_{TX31}$, $\phi_{TX32}$ are lower than the potentials $\phi_{PG1}$, $\phi_{PG2}$.

The electric potential VPG is set higher than the electric potential yielded when the detection gate signals $S_1$, $S_2$ and the charge transfer signals $S_{31}$, $S_{32}$ are at a low level. When the detection gate signals $S_1$, $S_2$ are at the low level, the potentials $\phi_{TX1}$, $\phi_{TX2}$ are higher than the potentials $\phi_{PG1}$, $\phi_{PG2}$. Furthermore, when the charge transfer signals $S_{31}$, $S_{32}$ are at the low level, the potentials $\phi_{TX31}$, $\phi_{TX32}$ are higher than the potentials $\phi_{PG1}$, $\phi_{PG2}$.

As described above, in the present embodiment, the photogate electrode PG1 is disposed on the charge generating region, the first gate electrode TX1 is disposed between the first semiconductor region FD1 and the charge generating region, and the third gate electrode $TX3_1$ is disposed between the charge generating region and the third semiconductor region $FD3_1$. Furthermore, the photogate electrode PG2 is disposed on the charge generating region, the second gate electrode TX2 is disposed between the second semiconductor region FD2 and the charge generating region, and the third gate electrode $TX3_2$ is disposed between the charge generating region and the third semiconductor region $FD3_2$.

When the signal charges are transferred to the first semiconductor region FD1, a potential gradient descending from the third gate electrode $TX3_1$ side to the first gate electrode TX1 side is formed across regions immediately below the photogate electrode PG1, the first gate electrode TX1 and the third gate electrode $TX3_1$. When the signal charges are transferred to the second semiconductor region FD2, a potential gradient descending from the third gate electrode $TX3_2$ side to the second gate electrode TX2 side is formed across regions immediately below the photogate electrode PG2, the second gate electrode TX2 and the third gate electrode $TX3_2$. Accordingly, the charges generated in the regions (charge generating regions) immediately below the photogate electrodes PG1, PG2 definitely migrate to the first and second semiconductor regions FD1, FD2, but find it difficult to migrate to the third semiconductor regions FD3$_1$, FD3$_2$. In particular, when the signal charges are transferred to the first and second semiconductor regions FD1, FD2, the potentials $\phi_{TX31}$, $\phi_{TX32}$ in the regions immediately below the third gate electrodes TX3$_1$, TX3$_2$ are higher than the potentials $\phi_{PG1}$, $\phi_{PG2}$ in regions immediately below the photogate electrodes PG1, PG2, whereby it is difficult for the charges to migrate to the third semiconductor regions FD3$_1$, FD3$_2$. As a result, in the range image sensor 1, the transfer efficiency of the signal charges is improved.

When the unnecessary charges are transferred to the third semiconductor region FD3$_1$, a potential gradient descending from the first gate electrode TX1 side to the third gate electrode TX3$_1$ side is formed across regions immediately below the photogate electrode PG1, the first gate electrode TX1 and the third gate electrode TX3$_1$. When the unnecessary charges are transferred to the third semiconductor region FD3$_2$, a potential gradient descending from the second gate electrode TX2 side to the third gate electrode TX3$_2$ side is formed across regions immediately below the photogate electrodes PG2, the second gate electrode TX2 and the third gate electrode TX3$_2$. Accordingly, the charges generated in the regions (charge generating regions) immediately below the photogate electrodes PG1, PG2 definitely migrate to the third semiconductor regions FD3$_1$, FD3$_2$ as unnecessary charges, but find it difficult to migrate to the first and second semiconductor regions FD1, FD2. In particular, when signal charges are transferred to the third semiconductor regions FD3$_1$, FD3$_2$, the potentials $\phi_{TX1}$, $\phi_{TX2}$ in the regions immediately below the first and second gate electrodes TX1, TX2 are higher than the potentials $\phi_{PG1}$ and $\phi_{PG2}$ in the regions immediately below the photogate electrodes PG1, PG2, whereby it is difficult for charges to migrate to the first and second semiconductor regions FD1, FD2. As a result, in the range image sensor 1, the transfer efficiency of the unnecessary charges is improved.

These allow the range image sensor 1 in accordance with the present embodiment to improve an accuracy of distance detection.

Meanwhile, in the present embodiment, the first and second semiconductor regions FD1, FD2 are located on the inside of the photogate electrodes PG1, PG2, and areas of the first and second semiconductor regions FD1, FD2 set smaller than areas of the photogate electrodes PG1, PG2. For this reason, the areas of the first and second semiconductor regions FD1, FD2 are considerably reduced compared to areas of regions which can transfer charges to the first and second semiconductor regions FD1, FD2 in the regions (charge generating regions) immediately below the photogate electrodes PG1, PG2. Charges (the charge quantities Q1, Q2) transferred to and accumulated in the first and second semiconductor regions FD1, FD2 generate their respective voltage changes ($\Delta V$) represented by the following relational expressions according to the capacitance (Cfd) of the first and second semiconductor regions FD1, FD2.

$\Delta V = Q1/Cfd$ $\Delta V = Q2/Cfd$

Therefore, as the areas of the first and second semiconductor regions FD1, FD2 are reduced, the capacitance (Cfd) of the first and second semiconductor regions FD1, FD2 are reduced, thereby generating a greater voltage change ($\Delta V$). That is, a charge voltage conversion gain increases. As a result, high sensitivity of the range image sensor 1 can be achieved.

The first gate electrode TX1 surrounds the entire periphery of the first semiconductor region FD1. The second gate electrode TX2 surrounds the entire periphery of the second semiconductor region FD2. For this reason, the signal charges are collected in the first and second semiconductor regions FD1, FD2 from all directions of the first and second semiconductor regions FD1, FD2. As a result, the area efficiency (aperture ratio) of the imaging region can be improved.

The third semiconductor regions FD3$_1$, FD3$_2$ surround the entire peripheries of the charge generating regions (photogate electrodes PG1, PG2). This separates charge generating regions, whereby it is feasible to suppress an occurrence of cross talk. Furthermore, adjacent charge generating regions are formed as spatially separated from each other, and the third semiconductor regions FD3$_1$, FD3$_2$ are located between the adjacent charge generating regions. For this reason, the unnecessary charges definitely migrate to the third semiconductor regions FD3$_1$, FD3$_2$, and therefore the transfer efficiency of the unnecessary charges can be further improved.

In the present embodiment, the adjacent third semiconductor regions FD3$_1$, FD3$_2$ are formed integrally with each other. This reduces the distance between the adjacent charge generating regions, thereby increasing the usage efficiency of the sensor area. As a result, a spatial resolution can be improved.

Next, referring to FIGS. 10 to 20, the configuration of the range image sensor 1 according to a modification example of the present embodiment will be described.

Figure 10:
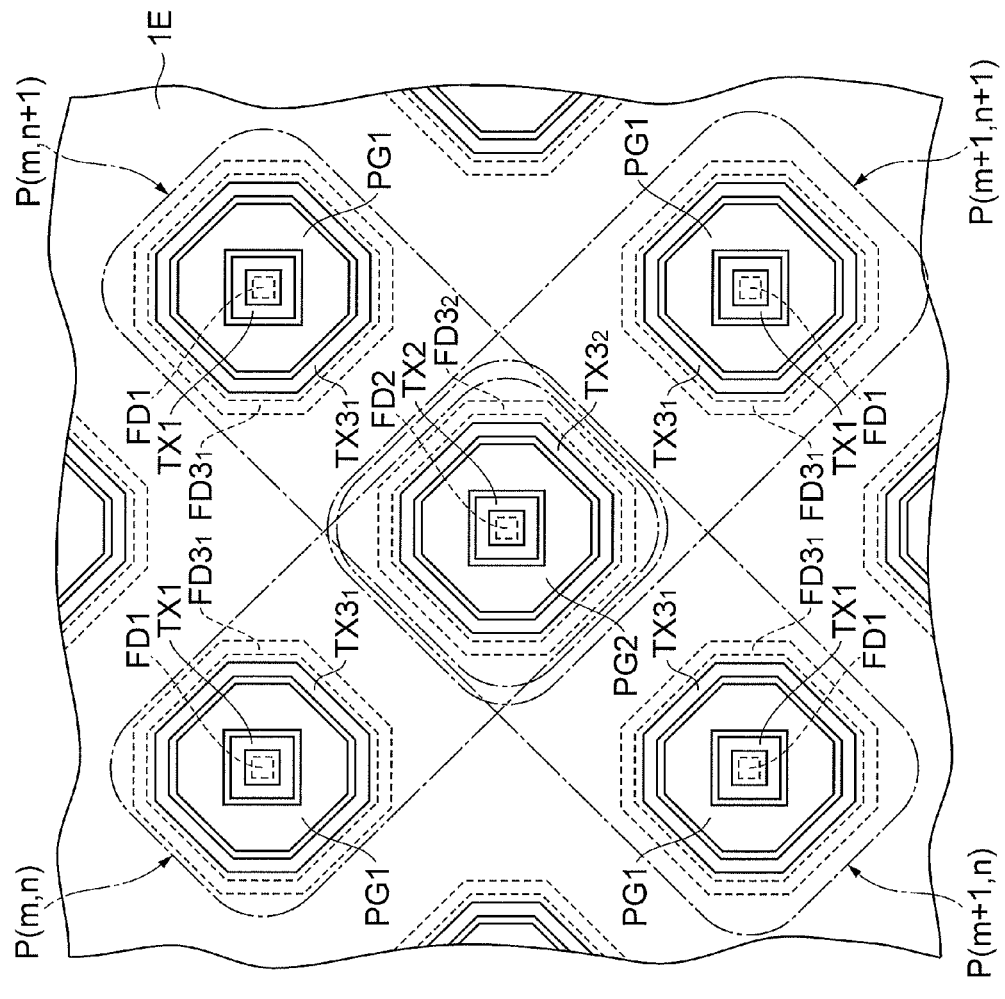
FIG. 10 is a schematic diagram for explaining a configuration of a pixel of a range image sensor according to a modification example.

In present modification example shown in FIG. 10, shapes of the photogate electrodes PG1, PG2, the third gate electrodes TX3$_1$, TX3$_2$ and the third semiconductor regions FD3$_1$, FD3$_2$ and an arrangement of each unit including the photogate electrodes PG1, PG2 are different from those of the above-described embodiment. FIG. 10 is a schematic diagram for explaining a configuration of pixels in a range image sensor in accordance with the modified example.

The inner contours of the photogate electrodes PG1, PG2 are rectangle-shaped (in detail, square-shaped), and the outer contours thereof are octagon-shaped. The third gate electrodes TX3$_1$, TX3$_2$ and the third semiconductor regions FD3$_1$, FD3$_2$ are octagonal loop-shaped. A plurality of first semiconductor regions (in present modification example, four first semiconductor regions) FD1 are disposed at the vertices of imaginary polygons (in present modification example, squares). The second semiconductor region FD2 is disposed at the center of a square whose vertices are formed by the first semiconductor regions FD1. The imaginary polygons may be triangles or polygons with five or more vertices, other than squares.

In present modification example, in regard to a single second unit including the photogate electrode PG2 (charge generating region immediately below photogate electrode PG2), a plurality of first units (in present modification example, four first units) including the photogate electrodes PG1 (charge generating regions immediately below the photogate electrodes PG1) is disposed adjacent to each other. One first unit including the photogate electrode PG1 constitutes one pixel P(m, n), along with one second unit including the photogate electrode PG2. That is, in FIG. 10, four first units and one second unit constitute four pixels P(m, n), P(m, n+1), P(m+1, n), and P (m+1, n+1). In the present variation, this can increase the usage efficiency of the sensor area and therefore improve the spatial resolution.

Figure 11:
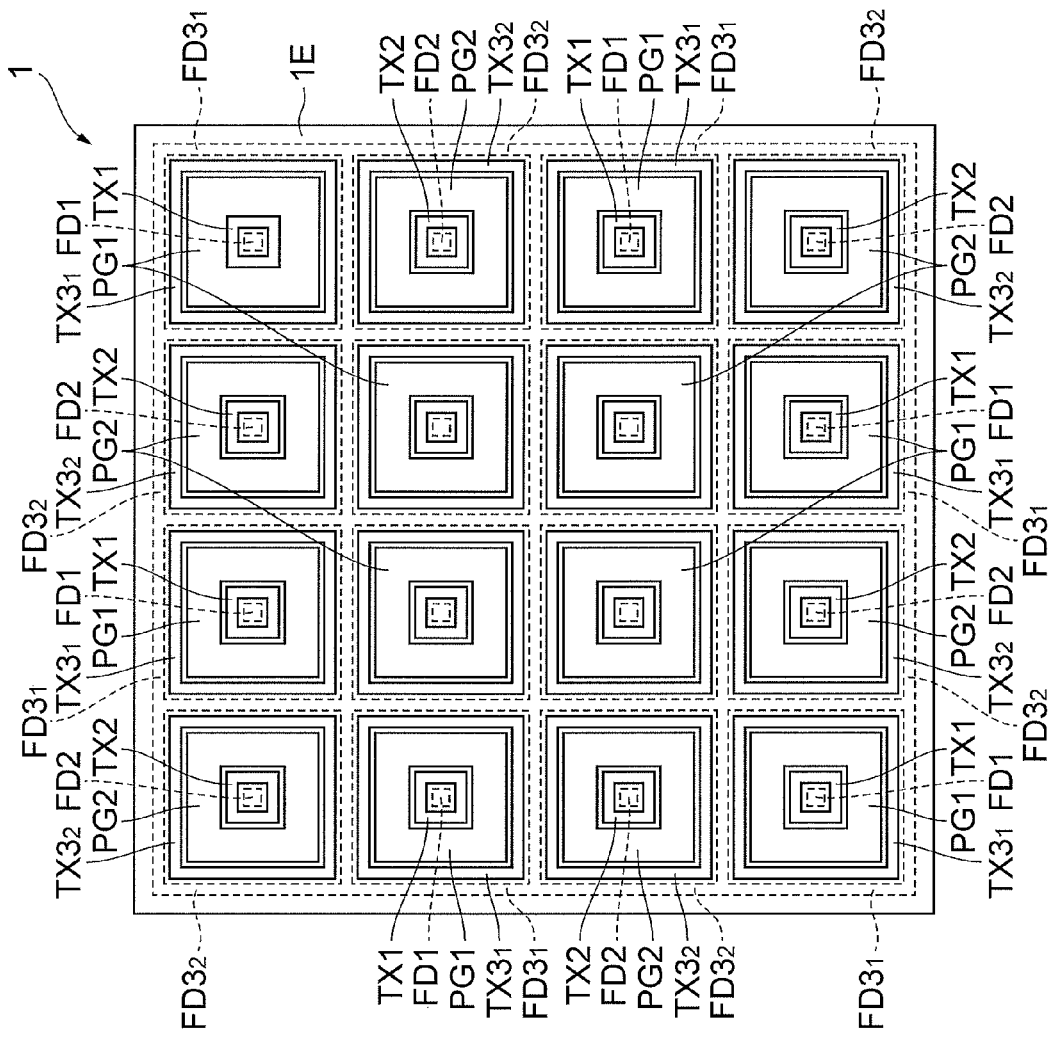
FIG. 11 is a schematic diagram for explaining a configuration of a pixel of a range image sensor according to a modification example.

In a modification example shown in FIG. 11, a plurality of first units including the photogate electrodes PG1 and a plurality of second units including the photogate electrodes PG2 are alternately arranged in row and column directions. FIG. 11 is a schematic diagram illustrating a configuration of pixels of a range image sensor according to the present variation.

In regard to one first unit, the one first unit constitutes one pixel P(m, n), along with each of a plurality of adjacent second units. In the same way, in regard to one second unit, the one second unit constitutes one pixel P(m, n), along with each of a plurality of adjacent first units. That is, in FIG. 11, eight first units and eight second units constitute 24 pixels P(m, n). In the present variation, this can increase the usage efficiency of the sensor area and therefore improve the spatial resolution.

Figure 12:
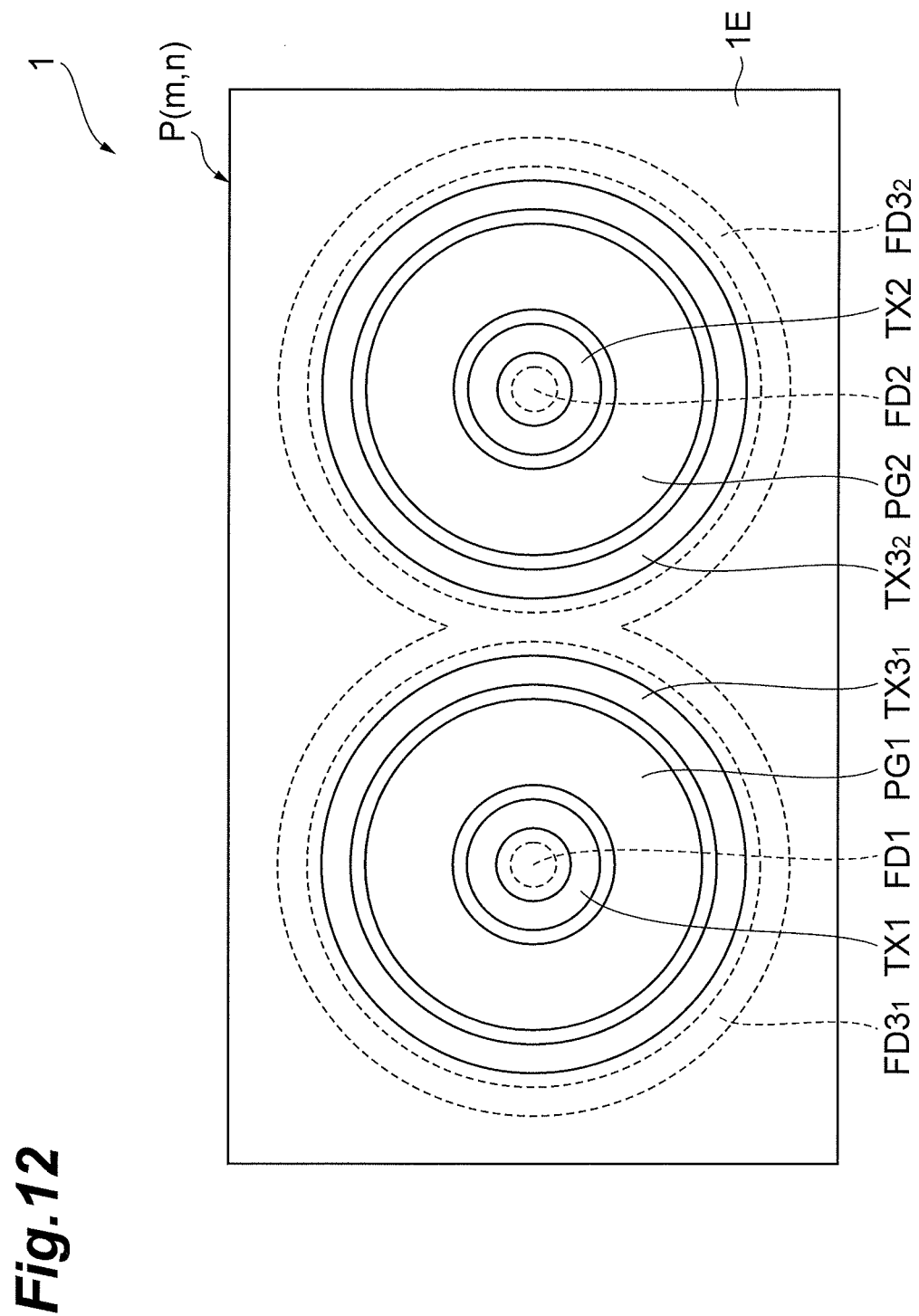
FIG. 12 is a schematic diagram for explaining a configuration of a pixel of a range image sensor according to a modification example.

In a modification example shown in FIG. 12, shapes of the photogate electrodes PG1, PG2, the first and second gate electrodes TX1, TX2, the third gate electrodes TX3$_1$, TX3$_2$, the first and second semiconductor regions FD1, FD2, and third semiconductor regions FD3$_1$, FD3$_2$ are different from those of the above-described embodiment. FIG. 12 is a schematic diagram for explaining a configuration of a pixel in a range image sensor in accordance with the modified example.

The first and second semiconductor regions FD1, FD2 are circular-shaped. The photogate electrodes PG1, PG2, the first and second gate electrodes TX1, TX2, the third gate electrodes TX3$_1$, TX3$_2$, and the third semiconductor regions FD3$_1$, FD3$_2$ are circular loop-shaped.

Figure 13:
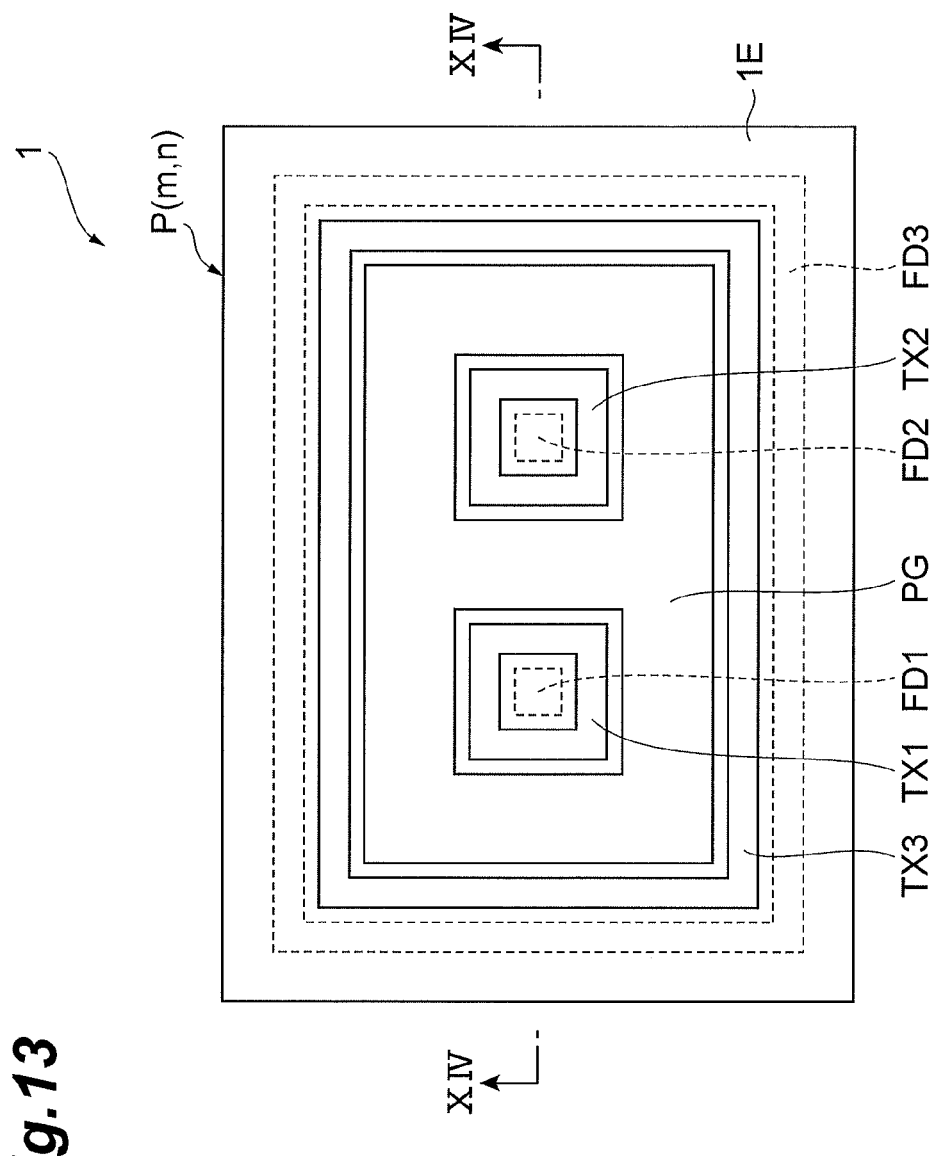
FIG. 13 is a schematic diagram for explaining a configuration of a pixel of a range image sensor according to a modification example.
Figure 14:
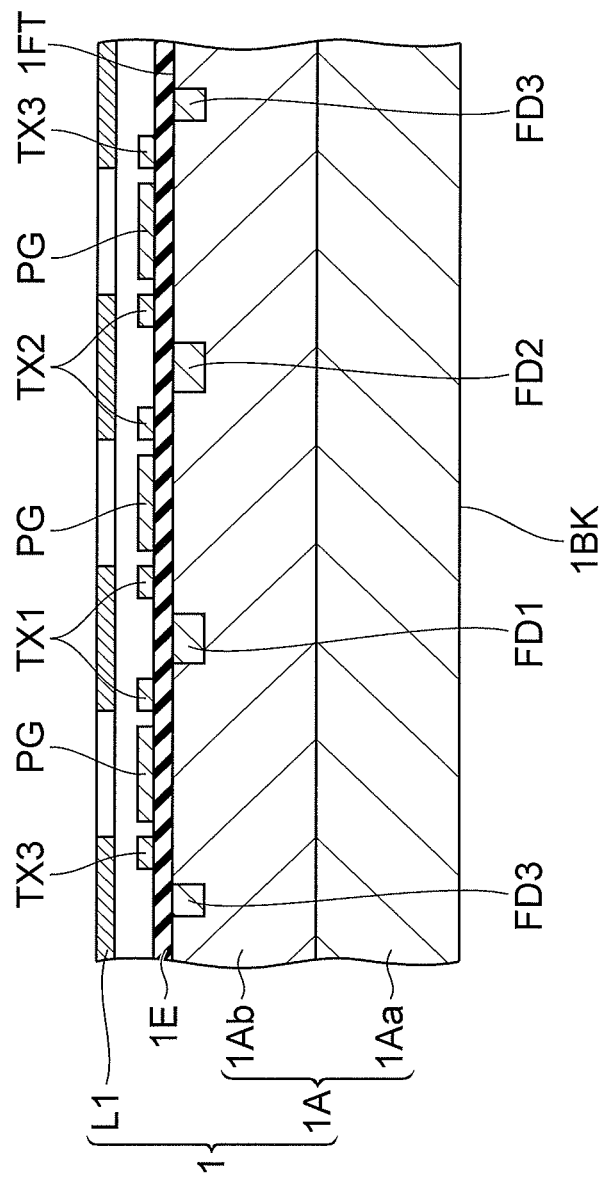
FIG. 14 is a diagram illustrating a cross-sectional configuration along line XIV-XIV in FIG. 13.

In a modification example shown in FIGS. 13 and 14, shapes of the photogate electrode PG, the third gate electrode TX3 and the third semiconductor region FD3 are different from those of the above-described embodiment. FIG. 13 is a schematic diagram for explaining a configuration of a pixel in a range image sensor in accordance with the modified example. FIG. 14 is a diagram illustrating a cross-sectional configuration along line XIV-XIV in FIG. 13.

The range image sensor according to the present modification example is provided with, in each pixel P(m, n), one photogate electrode PG, the first and second gate electrodes TX1, TX2, one third gate electrode TX3, the first and second semiconductor regions FD1, FD2, and one third semiconductor region FD3.

The photogate electrode PG has a form in which the photogate electrode PG1 and photogate electrode PG2 of the above-described embodiment are formed integrally with each other. That is, the photogate electrode PG is shared by the first unit (a unit including the first semiconductor region FD1) and the second unit (a unit including the second semiconductor region FD2). This causes the charge generating regions of the adjacent first and second units to be formed integrally with each other.

The third semiconductor region FD3 is disposed outside the photogate electrode PG so as to surround the photogate electrode PG. The third semiconductor region FD3 is arranged as spatially separated from a region immediately below the photogate electrode PG. That is, the third semiconductor region FD3 is disposed outside the light receiving region so as to surround the light receiving region, and is also arranged as spatially separated from the light receiving region. The third semiconductor region FD3 is rectangular loop-shaped when viewed in a plan view.

The third gate electrode TX3 is disposed between the photogate electrode PG and the third semiconductor region FD3. The third gate electrode TX3 is located outside the photogate electrode PG so as to surround the photogate electrode PG, and is also located inside the third semiconductor region FD3 so as to be surrounded by the third semiconductor region FD3. The third gate electrode TX3 is arranged as spatially separated from the photogate electrode PG and the third semiconductor region FD3 so as to be interposed between the photogate electrode PG and the third semiconductor region FD3. The third gate electrode TX3 is rectangular loop-shaped when viewed in a plan view.

Figure 15:
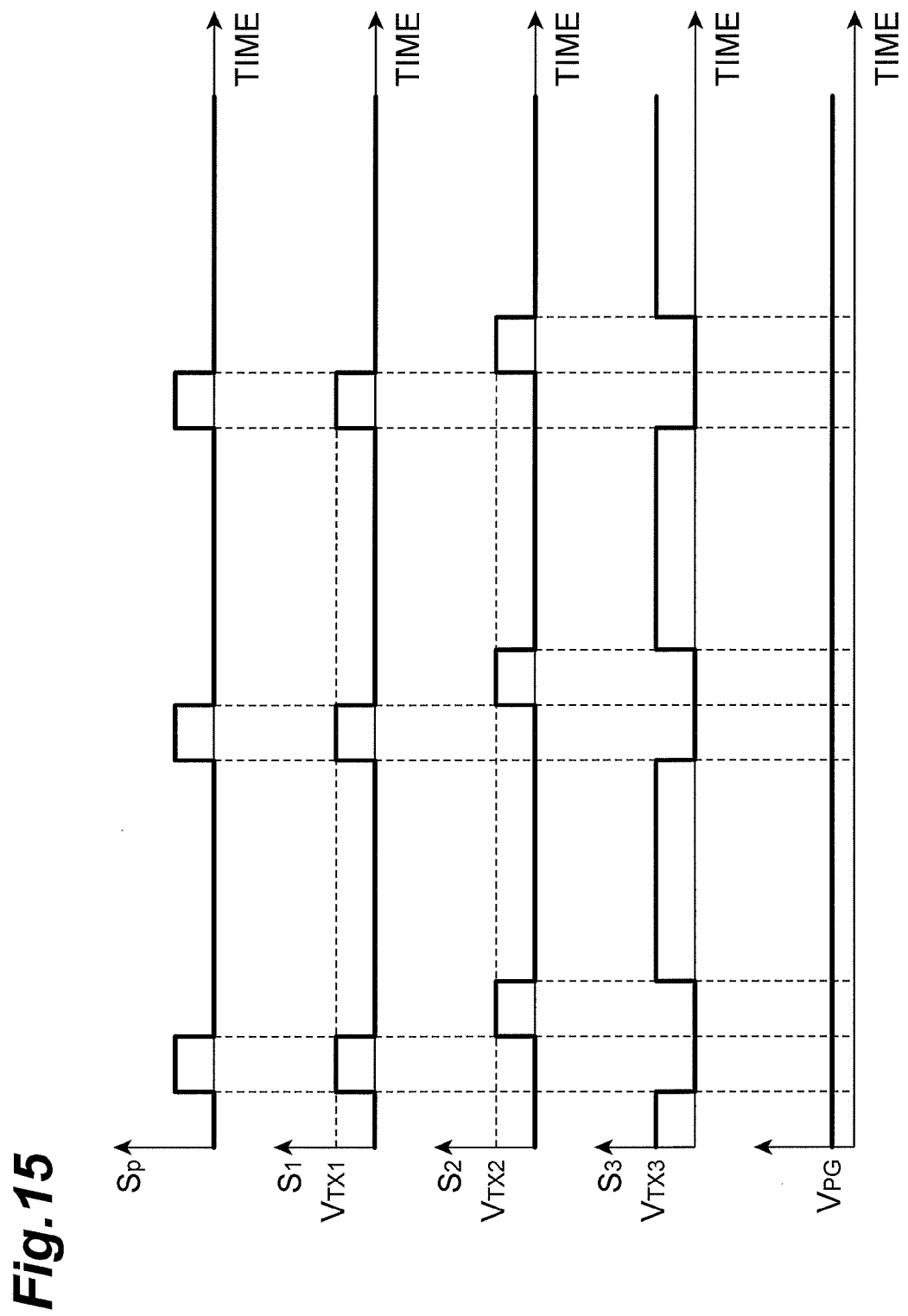
FIG. 15 is a timing chart of various signals.
Figure 16:
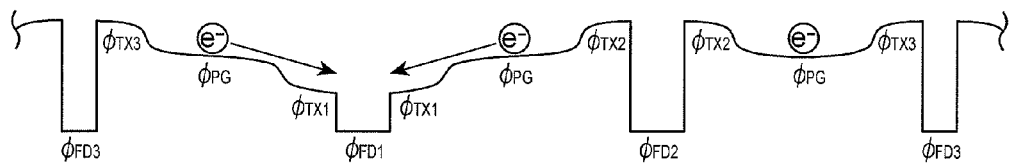
FIG. 16 is a diagram illustrating a potential profile, for explaining an accumulation operation of signal charges.
Figure 17:
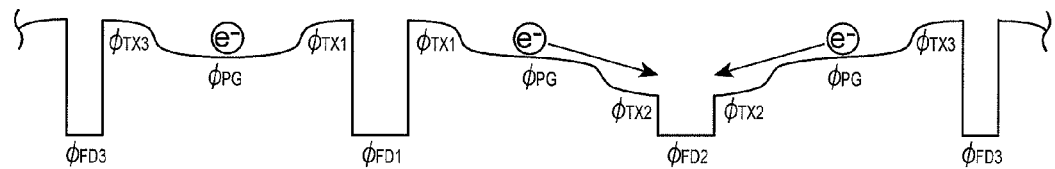
FIG. 17 is a diagram illustrating a potential profile, for explaining an accumulation operation of signal charges.
Figure 18:
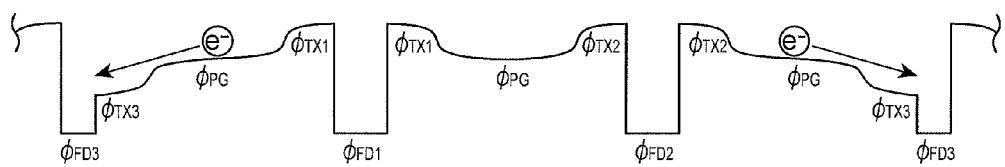
FIG. 18 is a diagram illustrating a potential profile, for explaining a discharge operation of unnecessary charges.

FIG. 15 is a timing chart of various signals in the modification example shown in FIGS. 13 and 14. FIGS. 16 and 17 are diagrams illustrating potential profiles for explaining an accumulation operation of signal charges. FIG. 18 is a diagram illustrating a potential profile for explaining a discharge operation of unnecessary charges.

In present modification example, when detection gate signals S$_1$, S$_2$ applied to the first and second gate electrodes TX1, TX2 are at a low level, a charge transfer signal S$_3$ applied to the third gate electrode TX3 is set to a high level, as shown in FIG. 15.

As shown in FIG. 16, when a high level signal (positive electric potential) is supplied to the first gate electrode TX1, a potential $\phi_{TX1}$ below the first gate electrode TX1 becomes lower than a potential $\phi_{PG}$ in a region immediately below the photogate electrode PG in the semiconductor substrate 1A. As a consequence, negative charges (electrons) are drawn toward the first gate electrode TX1, so as to be accumulated in a potential well formed by the first semiconductor region FD1. At this time, when a low level signal (for example, a ground electric potential) is supplied to the second gate electrode TX2, a potential barrier is generated by the second gate electrode TX2. Therefore, the charges generated in the semiconductor substrate 1A are not drawn into the second semiconductor region FD2.

As shown in FIG. 17, when a high level signal is supplied to the second gate electrode TX2, a potential $\phi_{TX2}$ below the second gate electrode TX2 becomes lower than the potential $\phi_{PG}$ in the region immediately below the photogate electrode PG in the semiconductor substrate 1A. As a consequence, negative charges (electrons) are drawn toward the second gate electrode TX2, so as to be accumulated in a potential well formed by the second semiconductor region FD2. When a low level signal is supplied to the first gate electrode TX1, a potential barrier is generated by the first gate electrode TX1. Therefore, the charges generated in the semiconductor substrate 1A are not drawn into the first semiconductor region FD1.

While the detection gate signal S$_1$ is being applied to the first gate electrode TX1 and the detection gate signal S$_2$ is being applied to the second gate electrode TX2, a low level signal is supplied to the third gate electrode TX3. For this reason, a potential $\phi_{TX3}$ in a region immediately below the third gate electrode TX3 is not lowered, and charges do not flow into the potential well of the third semiconductor region FD3.

As shown in FIG. 18, when a high level signal is supplied to the third gate electrode TX3, the potential $\phi_{TX3}$ in the region immediately below the third gate electrode TX3 becomes lower than the potential $\phi_{PG}$ in the region immediately below the photogate electrode PG in the semiconductor substrate 1A. As a consequence, negative charges (electrons) are drawn toward the third gate electrode TX3, so as to be collected in the potential well formed by the third semiconductor region FD3.

In the present modification example, charge generating regions are expanded relative to the first and second semiconductor regions FD1, FD2, and therefore there is an increase in the signal charges moving to the first and second semiconductor regions FD1, FD2. As a result, the transfer efficiency of the signal charges can be further improved.

Figure 19:
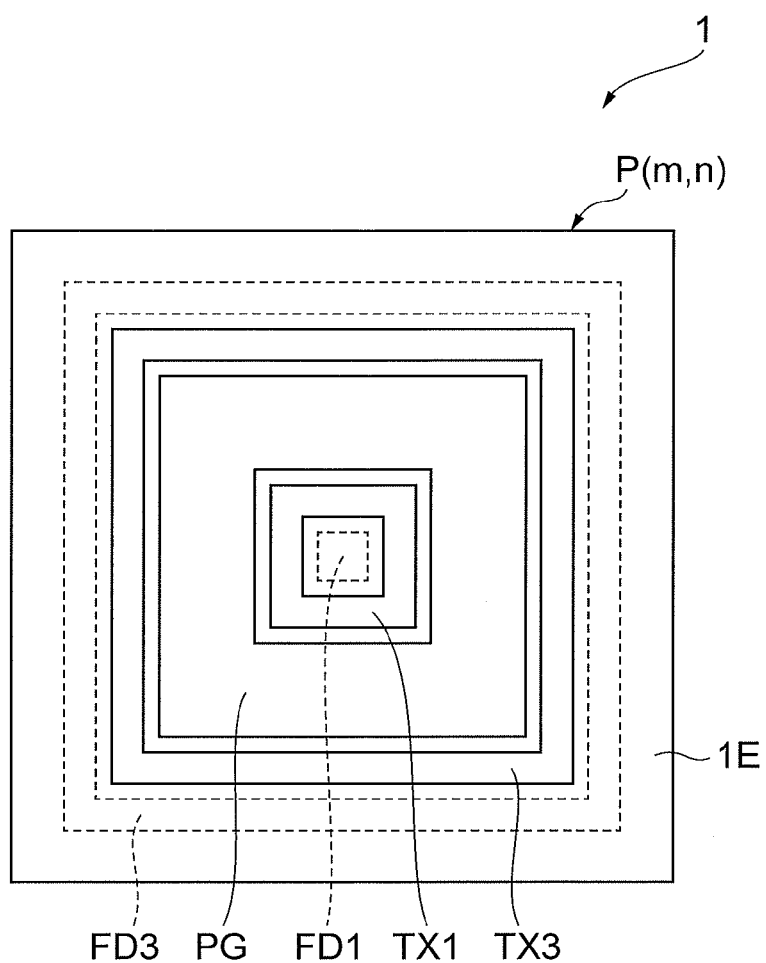
FIG. 19 is a schematic diagram for explaining a configuration of a pixel of a range image sensor according to a modification example.

A modification example shown in FIG. 19 is different from the above-described embodiment in that one unit including the photogate electrode PG constitutes a pixel P(m, n). FIG. 19 is a schematic diagram for explaining a configuration of a pixel of a range image sensor according to the modification example.

The range image sensor according to the present modification example is provided with, in each pixel P(m, n), the photogate electrode PG, the first gate electrode TX1, the third gate electrode TX3, the first semiconductor region FD1, and the third semiconductor region FD3. The configuration of one unit which constitutes each pixel P(m, n) is the same as that of the first unit (or second unit) of the above-described embodiment.

Figure 20:
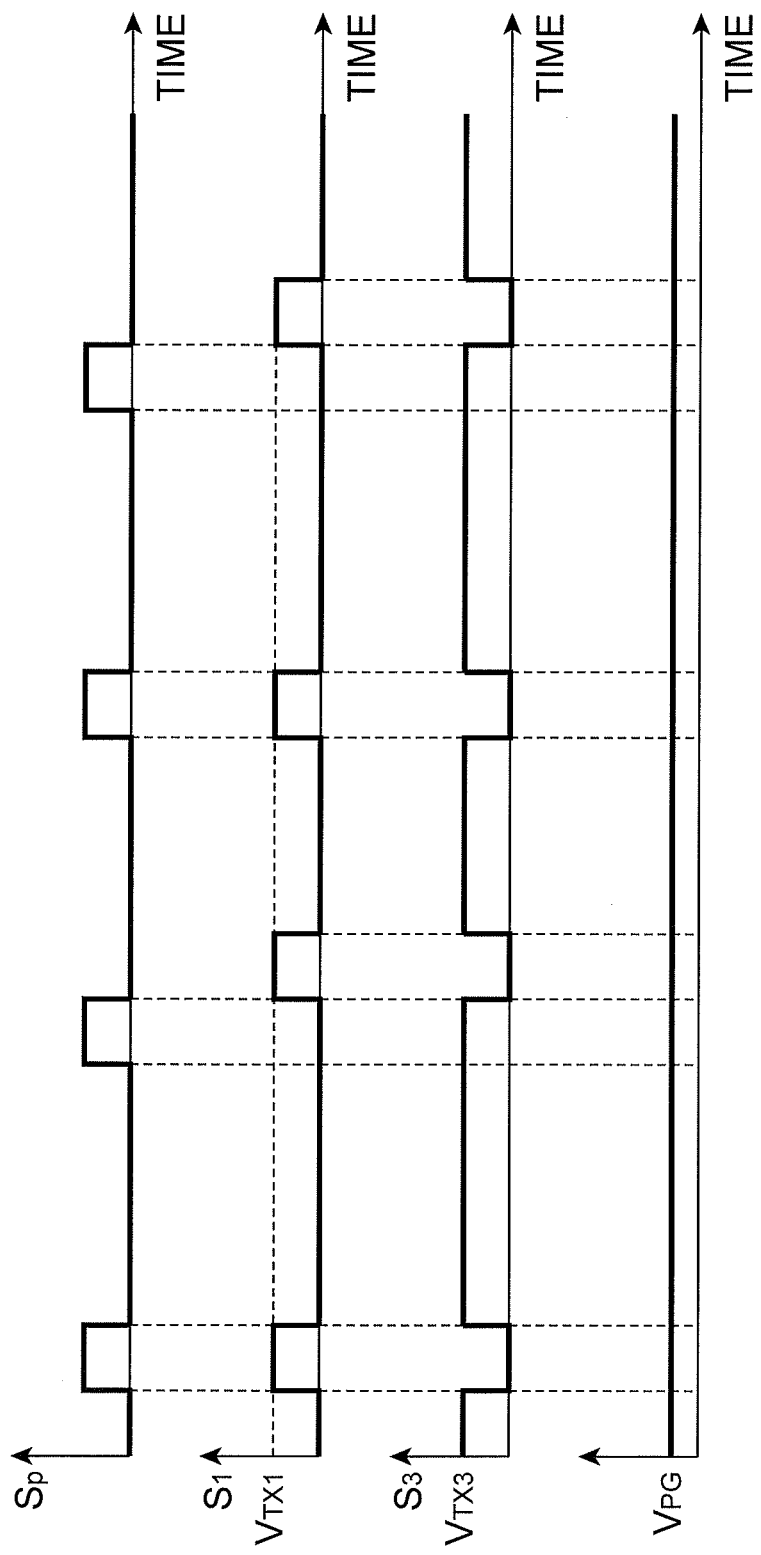
FIG. 20 is a timing chart of various signals.

FIG. 20 is a timing chart of various signals in the modification example shown in FIG. 19. As shown in FIG. 20, the detection gate signal $S_1$ applied to the first gate electrode TX1 is intermittently given a phase shift at a predetermined timing. In the present modification example, the detection gate signal $S_1$ is given a phase shift of 180° at a timing of 180°. The detection gate signal $S_1$ is synchronized with the pulse drive signal $S_P$ at a timing of 0°, and has a phase difference of 180° with respect to the pulse drive signal $S_P$ at a timing of 180°. The phases of the detection gate signal $S_1$ and the charge transfer signal $S_3$ are opposite.

In the present modification example, signal charges accumulated in the first semiconductor region FD1 are read out as an output ($V_{out1}$) from the first semiconductor region FD1 at a timing of 0°, and signal charges accumulated in the first semiconductor region FD 1 are read out as an output ($V_{out2}$) from the first semiconductor region FD1 at a timing of 180°. These outputs ($V_{out1}$, $V_{out2}$) correspond to the above-described signal d'(m, n). One unit including the photogate electrode PG (the charge generating region immediately below the photogate electrode PG) corresponds to one pixel, and the distance is calculated based on outputs from the same pixel. For this reason, this configuration can reduce the deviation in the calculation of the distance compared to a configuration in which a plurality of units corresponds to one pixel. Furthermore, this configuration can increase the usage efficiency of the sensor area and therefore improve the spatial resolution.

The detection gate signal $S_1$ may be given a phase shift of 90° at a timing of 90°, a phase shift of 180° at a timing of 180°, and a phase shift of 270° at a timing of 270°. In this case, signal charges accumulated in the first semiconductor region FD1 are read out as outputs from the first semiconductor region FD1 at a timing of 0°, 90°, 180°, and 270°, and the distance is calculated based on these outputs.

The above described the preferred embodiments of the present invention, but it should be noted that the present invention is not always limited to the above embodiments but can be modified in many ways without departing from the scope and spirit of the invention.

Figure 21:
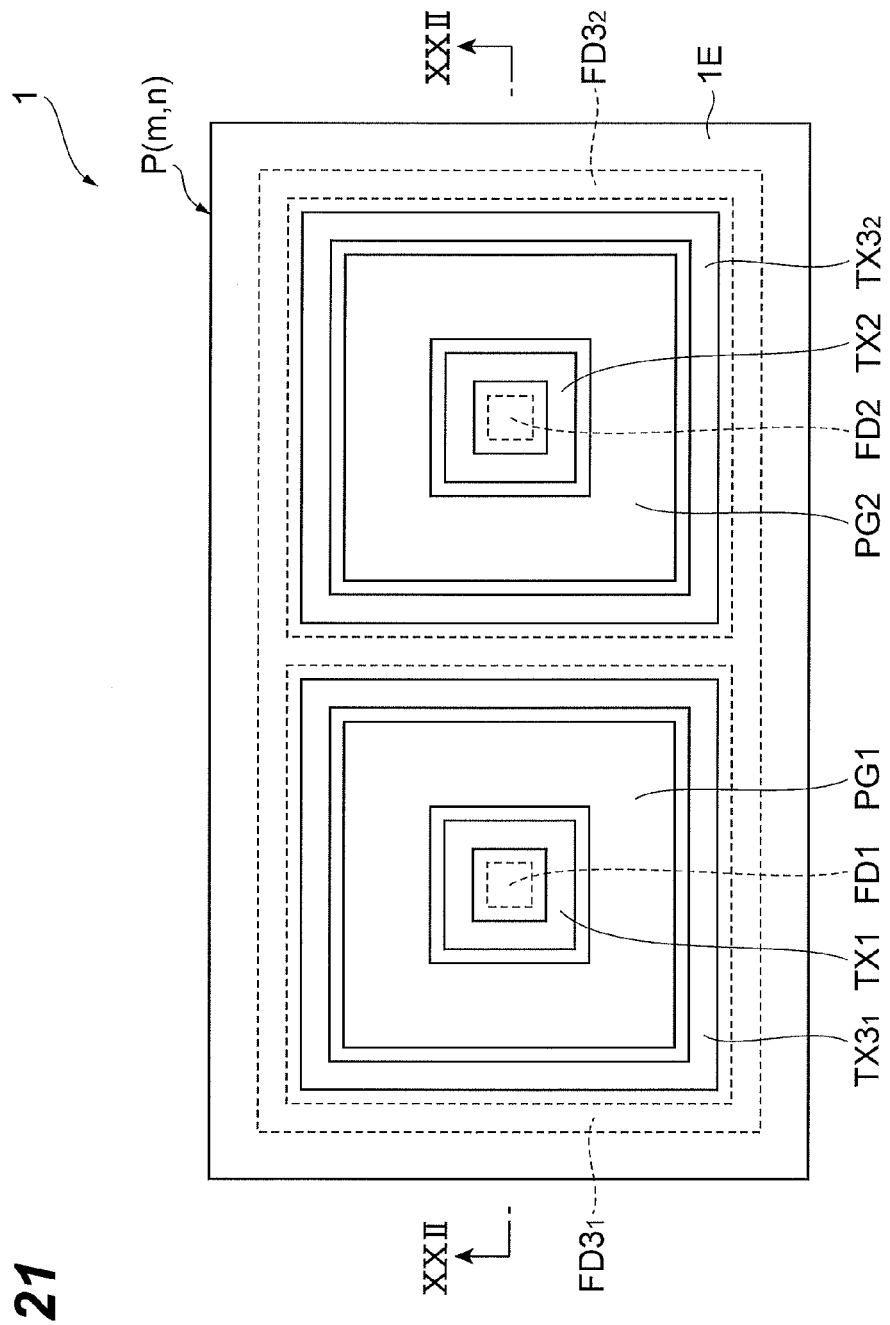
FIG. 21 is a schematic diagram for explaining a configuration of a pixel of a range image sensor according to a modification example.
Figure 22:
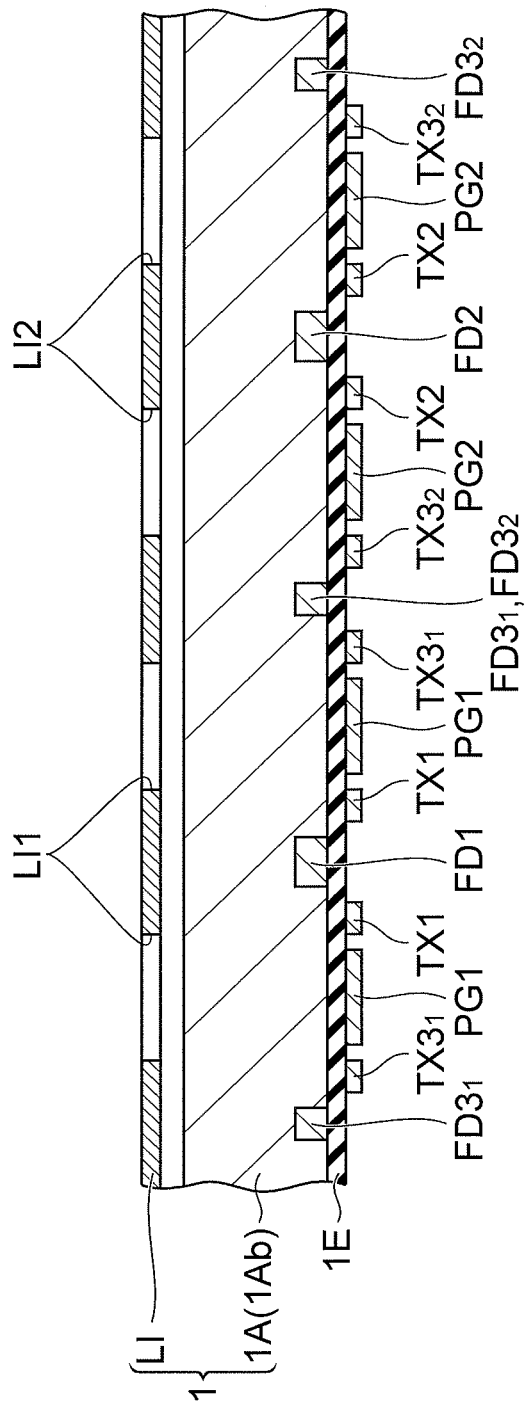
FIG. 22 is a diagram illustrating a cross-sectional configuration along line XXII-XXII in FIG. 21.

The range image sensor 1 may be a back-illuminated type range image sensor, as shown in FIGS. 21 and 22. The semiconductor substrate 1A is thinned from the back surface 1BK side so as to achieve a desired thickness. As a consequence, the first substrate region 1Aa is removed, so that the second substrate region 1Ab is exposed.

The charge generating region where charges are generated in response to incident light may be constituted of a photodiode (for example, an implanted photodiode or the like). The range image sensor 1 is not limited to a configuration in which pixels P(m, n) are disposed in a two-dimensional arrangement, but may have a configuration in which pixels P(m, n) are disposed in a one-dimensional arrangement.

The p- and n-type conductions in the range image sensor 1 in accordance with the above-mentioned embodiment are interchangeable.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A range sensor comprising:
   a charge generating region configured to generate charges in response to incident light;
   a signal charge collecting region disposed inside the charge generating region so as to be surrounded by the charge generating region, and configured to collect signal charges from the charge generating region;
   an unnecessary charge collecting region disposed outside the charge generating region so as to surround the charge generating region, and configured to collect unnecessary charges from the charge generating region;
   a photogate electrode disposed on the charge generating region;
   a transfer electrode disposed between the signal charge collecting region and the charge generating region, and configured to cause the signal charges from the charge generating region to flow into the signal charge collecting region in response to an input signal; and
   an unnecessary charge collecting gate electrode disposed between the unnecessary charge collecting region and the charge generating region, and configured to cause the unnecessary charges in the charge generating region to flow into the unnecessary charge collecting region in response to an input signal.

2. The range sensor according to claim 1, comprising a plurality of said charge generating regions, a plurality of said signal charge collecting regions, a plurality of said unnecessary charge collecting regions, a plurality of said photogate electrodes, a plurality of said transfer electrodes, and a plurality of said unnecessary charge collecting gate electrodes;
   wherein the plurality of the transfer electrodes are supplied respective charge transfer signals having different phases.

3. The range sensor according to claim 2,
   wherein adjacent said unnecessary charge collecting regions are formed integrally with each other.

4. The range sensor according to claim 2,
   wherein the plurality of the charge generating regions are formed as spatially separated from each other.

5. The range sensor according to claim 2,
   wherein adjacent said charge generating regions are formed integrally with each other, and
   adjacent said photogate electrodes are formed integrally with each other.

6. The range sensor according to claim 1,
   wherein the transfer electrode is supplied a transfer signal which is intermittently given a phase shift at a predetermined timing.

7. The range sensor according to claim 1,
   wherein the photogate electrode, the transfer electrode and the unnecessary charge collecting gate electrode are concentrically disposed around the signal charge collecting region in an order of the transfer electrode, the photogate electrode, and the unnecessary charge collecting gate electrode from the signal charge collecting region side.

8. The range sensor according to claim 1,
   wherein the signal charge collecting region is rectangular-shaped when viewed in a plan view, and
   the photogate electrode, the transfer electrode, and the unnecessary charge collecting gate electrode are approximately polygonal loop-shaped.

9. The range sensor according to claim 1,
wherein the signal charge collecting region is circular-shaped when viewed in a plan view, and
the photogate electrode, the transfer electrode, and the unnecessary charge collecting gate electrode are approximately circular loop-shaped.

10. A range image sensor comprising an imaging region including a plurality of units disposed in a one-dimensional or two-dimensional arrangement on a semiconductor substrate and which obtains a range image based on charge quantities output from the units,
wherein each of the units is the range sensor set forth in claim 1.

11. The range image sensor according to claim 10,
wherein adjacent two units out of the plurality of the units constitute one pixel of the imaging region.

12. The range image sensor according to claim 11,
wherein any one unit out of the plurality of the units and a plurality of the units adjacent said any one unit constitute one pixel of the imaging region.

13. The range image sensor according to claim 10,
wherein each of the units constitutes one pixel of the imaging region.

\* \* \* \* \*